(12) United States Patent
Scheuerlein et al.

(10) Patent No.: US 6,856,572 B2
(45) Date of Patent: Feb. 15, 2005

(54) MULTI-HEADED DECODER STRUCTURE UTILIZING MEMORY ARRAY LINE DRIVER WITH DUAL PURPOSE DRIVER DEVICE

(75) Inventors: Roy E. Scheuerlein, Cupertino, CA (US); Matthew P. Crowley, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/306,887

(22) Filed: Nov. 27, 2002

(65) Prior Publication Data

US 2003/0214841 A9 Nov. 20, 2003

Related U.S. Application Data

(63) Continuation-in-part of application No. 09/897,705, filed on Jun. 29, 2001, now Pat. No. 6,631,085, and a continuation-in-part of application No. 09/896,814, filed on Jun. 29, 2001, now Pat. No. 6,567,287, which is a continuation-in-part of application No. 09/814,727, filed on Mar. 21, 2001, now Pat. No. 6,420,215, which is a continuation-in-part of application No. 09/560,626, filed on Apr. 28, 2000, now abandoned.
(60) Provisional application No. 60/277,794, filed on Mar. 21, 2001, provisional application No. 60/277,815, filed on Mar. 21, 2001, and provisional application No. 60/277,738, filed on Mar. 21, 2001.

(51) Int. Cl.[7] .................................................. G11C 8/00
(52) U.S. Cl. ...................... 365/230.06; 365/51; 365/63
(58) Field of Search ....................... 365/51, 63, 230.06, 365/230.08

(56) References Cited

U.S. PATENT DOCUMENTS

| 4,646,266 A | 2/1987 | Ovshinsky et al. |
| 5,751,012 A | 5/1998 | Wolstenholme et al. |
| 5,835,396 A | 11/1998 | Zhang |
| 5,963,500 A | 10/1999 | Taura et al. |
| 6,034,882 A | 3/2000 | Johnson et al. |
| 6,055,180 A | 4/2000 | Gudesen et al. |
| 6,185,121 B1 | 2/2001 | O'Neill |
| 6,185,122 B1 | 2/2001 | Johnson et al. |
| 6,363,000 B2 | 3/2002 | Perner et al. |
| 6,420,215 B1 | 7/2002 | Knall et al. |

(List continued on next page.)

OTHER PUBLICATIONS

Naji, Peter K., et al., "A 256kb 3.0V 1T1MTJ Nonvolatile Magnetoresistive RAM," 2001 IEEE ISSCC, Feb. 6, 2001, Paper 7.6, and associated slide handouts, 35 pages.

(List continued on next page.)

*Primary Examiner*—Son Mai
(74) *Attorney, Agent, or Firm*—Zagorin, O'Brien & Graham, LLP

(57) ABSTRACT

A memory array decoder organization readily interfaces to array lines having extremely dense pitch, and in particular interfaces to extremely dense array lines of a three-dimensional memory array. In an exemplary embodiment, a multi-headed decoder includes a group of array line driver circuits associated with a single decode node. Each array line driver circuit couples its associated array line through a first device to an associated upper bias node which is generated to convey either a selected bias condition or an unselected bias condition thereon appropriate for the array line. Each array line driver circuit also couples its associated array line through a second device to an associated lower bias node which is generated to convey an unselected bias condition appropriate for the array line. The array line driver circuits for several different decode nodes may be physically arranged in one or more banks.

46 Claims, 13 Drawing Sheets

U.S. PATENT DOCUMENTS

| | | |
|---|---|---|
| 6,545,898 B1 | 4/2003 | Scheuerlein |
| 6,567,287 B2 * | 5/2003 | Scheuerlein ................ 365/51 |
| 6,591,394 B2 | 7/2003 | Lee et al. |
| 6,618,295 B2 | 9/2003 | Scheuerlein |
| 6,631,085 B2 | 10/2003 | Kleveland et al. |
| 2002/0028541 A1 | 3/2002 | Lee et al. |
| 2003/0021148 A1 | 1/2003 | Scheuerlein |
| 2003/0053332 A1 * | 3/2003 | Kleveland et al. ..... 365/185.03 |
| 2003/0202404 A1 * | 10/2003 | Scheuerlein ................ 365/200 |
| 2004/0100831 A1 | 5/2004 | Knall et al. |
| 2004/0100852 A1 | 5/2004 | Scheuerlein et al. |

OTHER PUBLICATIONS

U.S. Appl. No. 09/990,894, filed Nov. 16, 2001, entitled "Integrated Circuit Memory Array with Fast Test Mode Utilizing Multiple Word Line Selection and Method Therefore," naming inventor Roy E. Scheuerlein.

* cited by examiner

MULTI-HEADED DECODER STRUCTURE UTILIZING MEMORY ARRAY LINE DRIVER WITH DUAL PURPOSE DRIVER DEVICE

CROSS-REFERENCE TO RELATED APPLICATION(S)

This application is a continuation-in-part of U.S. application Ser. No. 09/897,705, filed Jun. 29, 2001, now U.S. Pat. No. 6,631,085 which is a continuation-in-part of U.S. application Ser. No. 09/814,727, filed Mar. 21, 2001, now U.S. Pat. No. 6,420,215 which itself is a continuation-in-part of U.S. application Ser. No. 09/560,626, filed Apr. 28, 2000, now abandoned, each of which applications is hereby incorporated by reference; application Ser. No. 09/897,705 claims the benefit of U.S. Provisional Application No. 60/277,794, filed Mar. 21, 2001, the benefit of U.S. Provisional Application No. 60/277,815, filed Mar. 21, 2001, and the benefit of U.S. Provisional Application No. 60/277,738, filed Mar. 21, 2001, moreover, this application is also a continuation-in-part of U.S. application Ser. No. 09/896,814, filed Jun. 29, 2001 now U.S. Pat. No. 6,567,287, which application is hereby incorporated by reference; application Ser. No. 09/896,814 also claims the benefit of U.S. Provisional Application No. 60/277,794, filed Mar. 21, 2001, which application is hereby incorporated by reference; Application Ser. No. 09/896,814 also claims the benefit of U.S. Provisional Application No. 60/277,815, filed Mar. 21, 2001, and the benefit of U.S. Provisional Application No. 60/277,738, filed Mar. 21, 2001.

This application is related to co-pending U.S. application Ser. No. 10/306,888, filed on even date herewith, entitled "Tree Decoder Structure Particularly Well-Suited to Interfacing Array Lines Having Extremely Small Layout Pitch" by Roy E. Schenerlein and Matthew P. Crowley, which application is hereby incorporated by reference in its entirety.

BACKGROUND

The present invention relates to semiconductor integrated circuits containing memory arrays, and particularly those arrays incorporating array lines having extremely small pitch, and more particularly those having a three-dimensional memory array.

Semiconductor integrated circuits have progressively reduced their feature linewidths into the deep sub-micron regime. Moreover, recent developments in certain memory cell technologies have resulted in word lines and bit line having an extremely small pitch. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane of memory cells have been fabricated implanting such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication."

However, the area required for implementing decoder circuits for word lines and bit lines has not achieved such dramatic reductions. Consequently, interfacing the word line decoders and bit line decoders to such tightly spaced word lines and bit lines within such very dense arrays has become extremely difficult, and limits the density of memory arrays otherwise achievable. There remains a continued need for improved decoder structures capable of interfacing with large numbers of array lines having a very small pitch, and particularly if such array lines exist on more than one layer, as in a three-dimensional memory array having more than one plane of memory cells.

SUMMARY

An improved decoder organization for a memory array readily interfaces to array lines, such as word lines, having extremely dense pitch, and in particular interfaces to extremely dense array lines of a three-dimensional memory array. In exemplary embodiments, a multi-headed decoder includes a group of array line driver circuits associated with a single decode node. Each array line driver circuit at times couples its associated array line, such as through a first device, to an associated upper bias node which is generated to convey either a selected bias condition or an unselected bias condition. Each array line driver circuit also couples at other times its associated array line, such as through a second device, to an associated lower bias node which is generated to convey an unselected bias condition appropriate for the array line. The array line driver circuits for several different decode nodes may be physically arranged in one or more banks.

In some embodiments the decoder circuit is arranged to interface to array lines on a layer exiting to a given side of the array. Other array lines on the same layer may exit to the side opposite the given side, and may interface to other decoder circuits. In certain embodiments, each decode node includes a respective head associated with at least two array lines on each of at least two layers of a three-dimensional memory array. For some embodiments, the unselected bias condition appropriate for an array line may be a function of whether the array line layer is selected or unselected. The unselected bias condition appropriate for an array line may also be a function of the array line layer's position relative to the selected layer. In other embodiments, each decode node includes a respective head associated with a larger number of array lines on a single memory array layer, such as for a two-dimensional memory array having only one plane of memory cells.

In certain embodiments of the invention an integrated circuit includes a memory array having at least a plurality of array lines on a first layer of the memory array and a decoder circuit for generating a plurality of decoder outputs. A plurality of array line driver circuits, each responsive to an associated decoder output and having an output coupled to a corresponding one of the plurality of array lines is also included. Each respective array line driver circuit includes a first device for driving the respective array line at times to a selected array line bias condition and at other times to an unselected array line bias condition, and a second device for driving the respective array line at times to the unselected array line bias condition.

In some embodiments each respective first device is configured to couple the respective array line to an associated bias node which is driven at times to the unselected array line bias condition and at other times to a selected array line bias condition. The memory array may be a three-dimensional memory array having a plurality of array lines of a first type on each of at least two layers. Moreover, the plurality of array lines of the first type may be used as word lines for the array, and may be used as bit lines. In some embodiments the unselected bias condition at times may be an unselected bias voltage, and at times may be a floating state.

In some embodiments the integrated circuit may include a first bias generator circuit for generating on a first bias node at times the selected array line bias condition and at other times the unselected array line bias condition, and the respective first device of at least two array line driver circuits may be coupled to the first bias node. In some embodiments the integrated circuit may include a second bias generator circuit for generating on a second bias node at times the unselected array line bias condition, and the respective second device of at least two array line driver circuits may be coupled to the second bias node.

In some embodiments the respective first device of each array line driver circuits is a PMOS transistor having a threshold voltage lower in magnitude than the unselected bias voltage.

In some embodiments an integrated circuit includes a memory array having word lines and bit lines, and a decoder circuit including a plurality of decoder outputs. The integrated circuit further includes a respective word line driver circuit for each respective word line, each word line driver circuit responsive to an associated decoder output and having a first device for driving its associated word line to either a selected bias voltage or to an unselected bias condition conveyed on a first bus line, and having a second device for driving its associated word line to an unselected bias condition conveyed on a second bus line. The memory array may be, for certain embodiments, a three-dimensional memory array having word lines on at least two layers of the memory array. In some embodiments, each decoder output is associated with a respective plurality of word line driver circuits, each having word line driver circuits respectively associated with at least two word lines on each of at least two layers of the memory array. The unselected bias condition at times is generated as an unselected bias voltage, and for some embodiments, may be generated at times as a floating state.

In some embodiments the integrated circuit includes a plurality of first bias generator circuits for generating on a respective plurality of first bus nodes at times the selected bias voltage and at other times the unselected bias condition, and a plurality of second bias generator circuits for generating on a respective plurality of second bias nodes at times the unselected bias condition. The respective first device of at least two word line driver circuits may be coupled to one of the first bus nodes, and the respective second device of at least two word line driver circuits may be coupled to one of the second bus nodes.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
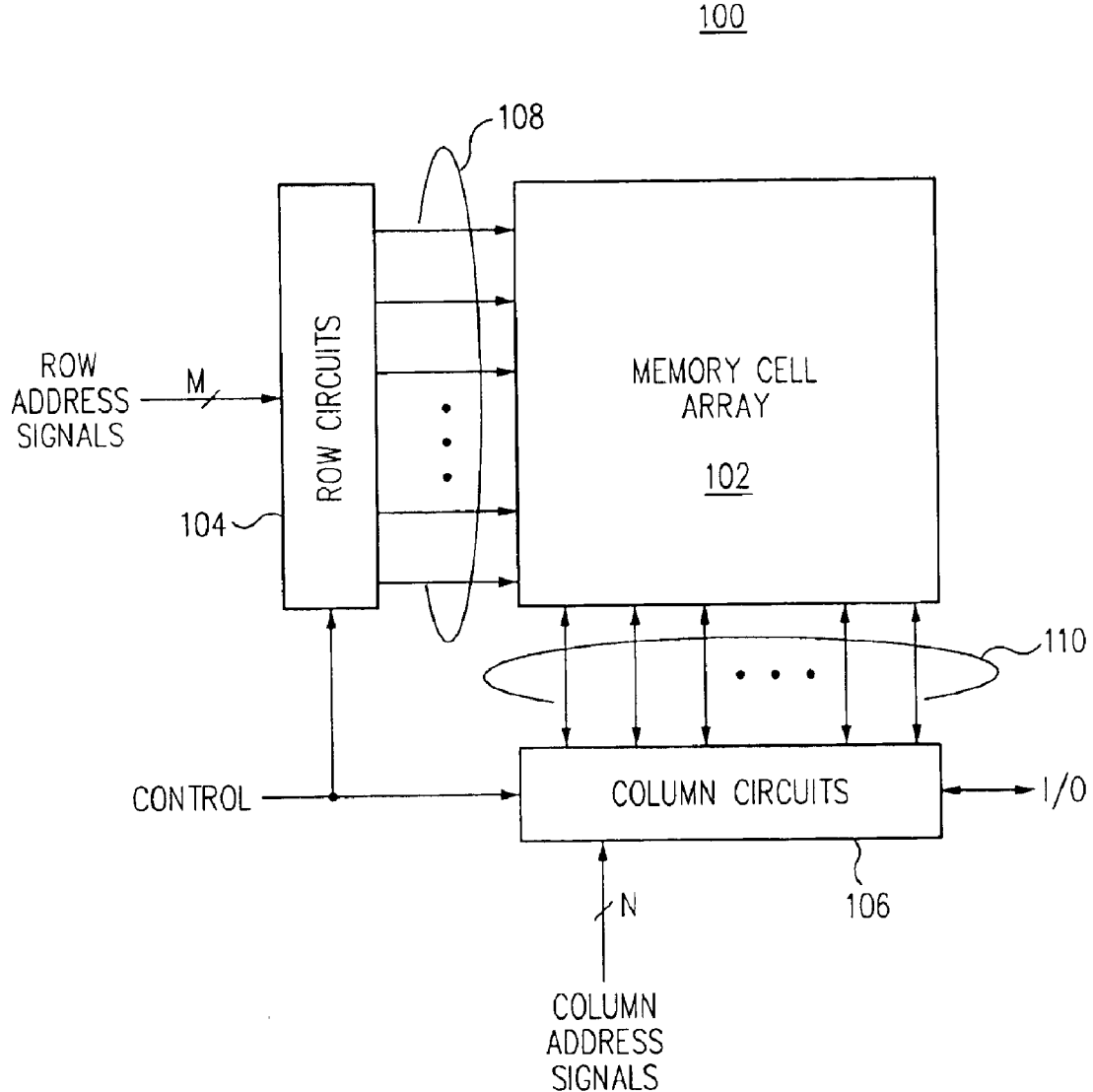
FIG. 1, labeled prior art, is a block diagram of a memory array and supporting row and column circuits.

Referring now to FIG. 1, a block diagram is shown of an integrated circuit 100 including a memory array 102. In one embodiment of the invention, the memory array 102 is preferably a three-dimensional, non-volatile, field-programmable write-once memory array of passive element memory cells, although other memory arrays are also suitable and specifically contemplated, including re-writable arrays and two-dimensional arrays. As used herein, an integrated circuit having a three-dimensional memory array is assumed to be a monolithic integrated circuit, rather than an assembly of more than one monolithic integrated circuit. Each passive element memory cell within the memory array 102 is preferably a two-terminal memory cell having a steering element in series with a state change element, together connected between usually orthogonal (but not necessarily so) array terminal lines. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

The array terminal lines (also called array lines) at one layer may be termed word lines or X-lines. The array lines at a vertically adjacent layer may be termed bit lines or Y-lines. A memory cell is formed at the projected intersection of each word line and each bit line, and is connected between the respective intersecting word line and bit line. A three-dimensional memory array which has at least two levels of memory cells (i.e., two memory planes) may utilize at least more than one layer of word lines or more than one layer of bit lines. A group of word lines, each residing on a separate layer and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

The array terminal lines of memory array 102 include the various layer(s) of word lines organized as rows, and the various layer(s) of bit lines organized as columns. The integrated circuit 100 includes a row circuits block 104 whose outputs 108 are connected to respective word lines of the memory array 102. The row circuits block 104 receives a group of M row address signals and one or more various control signals, and typically may include such circuits as row decoders and array terminal drivers for both read and write (i.e., programming) operations. The integrated circuit 100 also includes a column circuits block 106 whose input/outputs 110 are connected to respective bit lines of the memory array 102. The column circuits block 106 receives a group of N column address signals and one or more various control signals, and typically may include such circuits as column decoders, array terminal receivers, read/write circuitry, and I/O multiplexers. Circuits such as the row circuits block 104 and the column circuits block 106 may be collectively termed array terminal circuits for their connection to the various array terminals of the memory array 102.

Integrated circuits incorporating a memory array usually subdivide the array into a sometimes large number of sub-arrays. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. As used herein, an integrated circuit may include one or more than one memory array.

Figure 2:
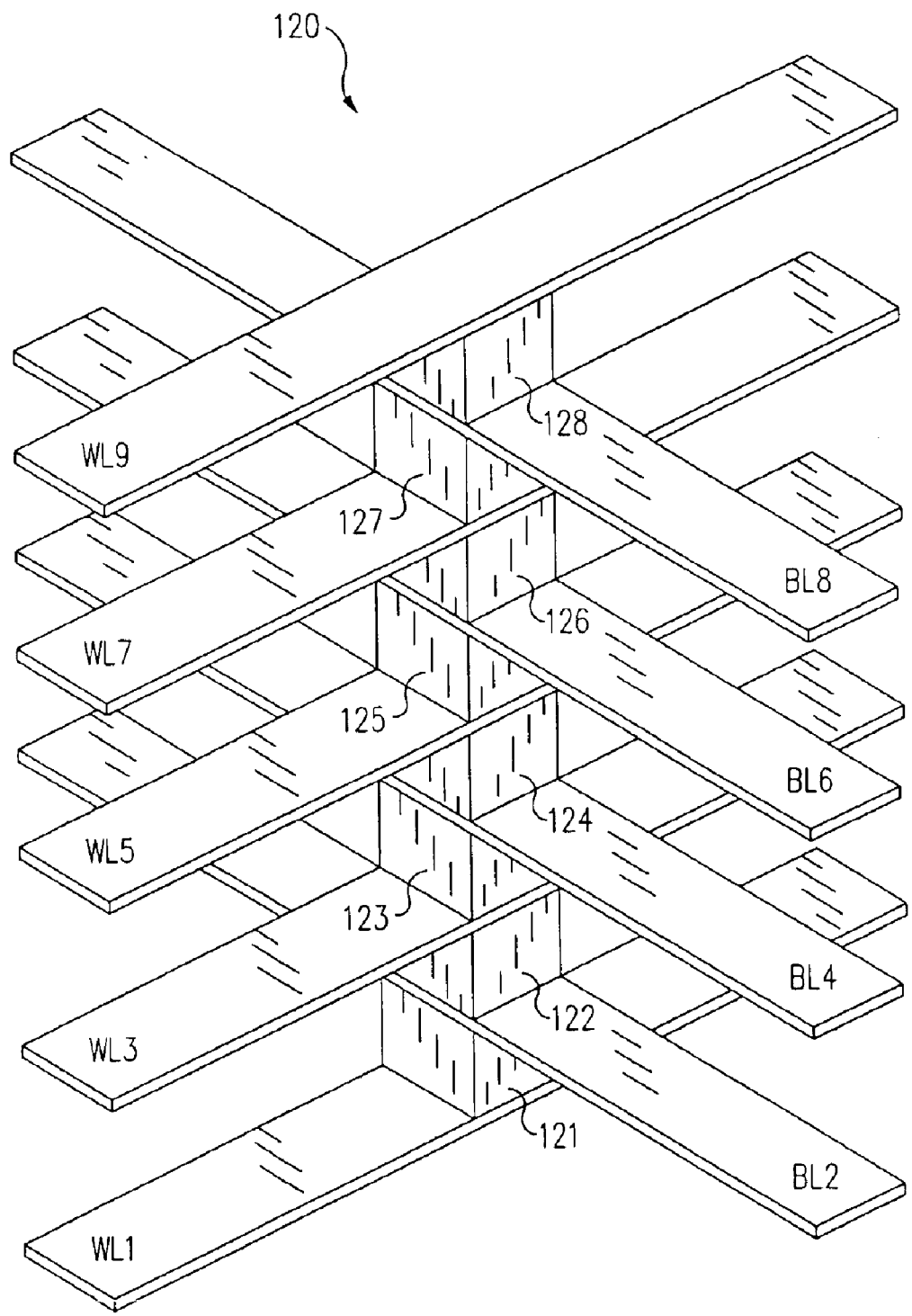
FIG. 2, labeled prior art, is a perspective view depicting an exemplary three-dimensional memory array.

FIG. 2 depicts an exemplary three-dimensional memory array 120 which incorporates passive element memory cells formed between vertically adjacent word lines and bit lines. Five word lines layers WL1, WL3, WL5, WL7, and WL9 are shown, and four bit line layers BL2, BL4, BL6, and BL8 are shown. A memory cell is formed at the projected intersection of each word line and bit line. For example, memory cell 123 is formed between word line WL3 and bit line BL4. Eight memory cells 121, 122, 123, 124, 125, 126, 127, and 128 are shown. As can be appreciated, a given bit line such as BL4 has a memory cell 124 formed above the bit line BL4, and another memory cell 123 formed below the bit line BL4, both of which are connected to the bit line BL4. A word line on the lower-most word line layer WL1 and a word line on the upper-most word line layer WL9 may be connected together and driven as one logical word line to address either memory cell 121 or 128, depending on whether bit line BL2 or BL8 is selected. In other words, there may be five actual word line layers which are treated as four logical layers.

In other configurations, the lower-most and upper-most layers may be bit line layers (e.g., BL1, BL3, BL5, BL7, and BL9), with word line layers vertically interspaced therebetween (e.g., WL2, WL4, WL6, and WL8). Similarly, a bit line on the lower-most layer BL1 and a bit line on the upper-most layer BL9 may be connected together and viewed as one logical bit line to address one of two memory cells, depending on which of word lines WL2 or WL8 is selected.

An advantageous passive element memory cell is a structure combining an antifuse and a diode in series as the memory cell. Suitable memory cells are described in U.S. Pat. No. 6,034,882 entitled "Vertically Stacked Field Programmable Nonvolatile Memory and Method of Fabrication." Particularly suitable memory cells are also described in U.S. Pat. No. 6,420,215 in which, for an exemplary embodiment, a multi-level memory array is formed of a first plurality of spaced-apart rail stacks disposed at a first height and/or a first direction above a substrate, and a second plurality of spaced-apart rail stacks disposed above the first plurality of rail stacks and run in a second direction different than the first direction. An insulating layer is formed between the first rail stack and the conductor of the second rail stack which is capable of being selectively breached by passing a current. Other advantageous memory cell arrays are described in U.S. patent application Ser. No. 09/897,705 entitled "Three-Dimensional Memory Array Incorporating Serial Chain Diode Stack" filed on Jun. 29, 2001, and U.S. patent application Ser. No. 09/560,626 entitled "Three-Dimensional Memory Array and Method of Fabrication" filed on Apr. 28, 2000, both of which are hereby incorporated by reference in their entirety.

Figure 3:
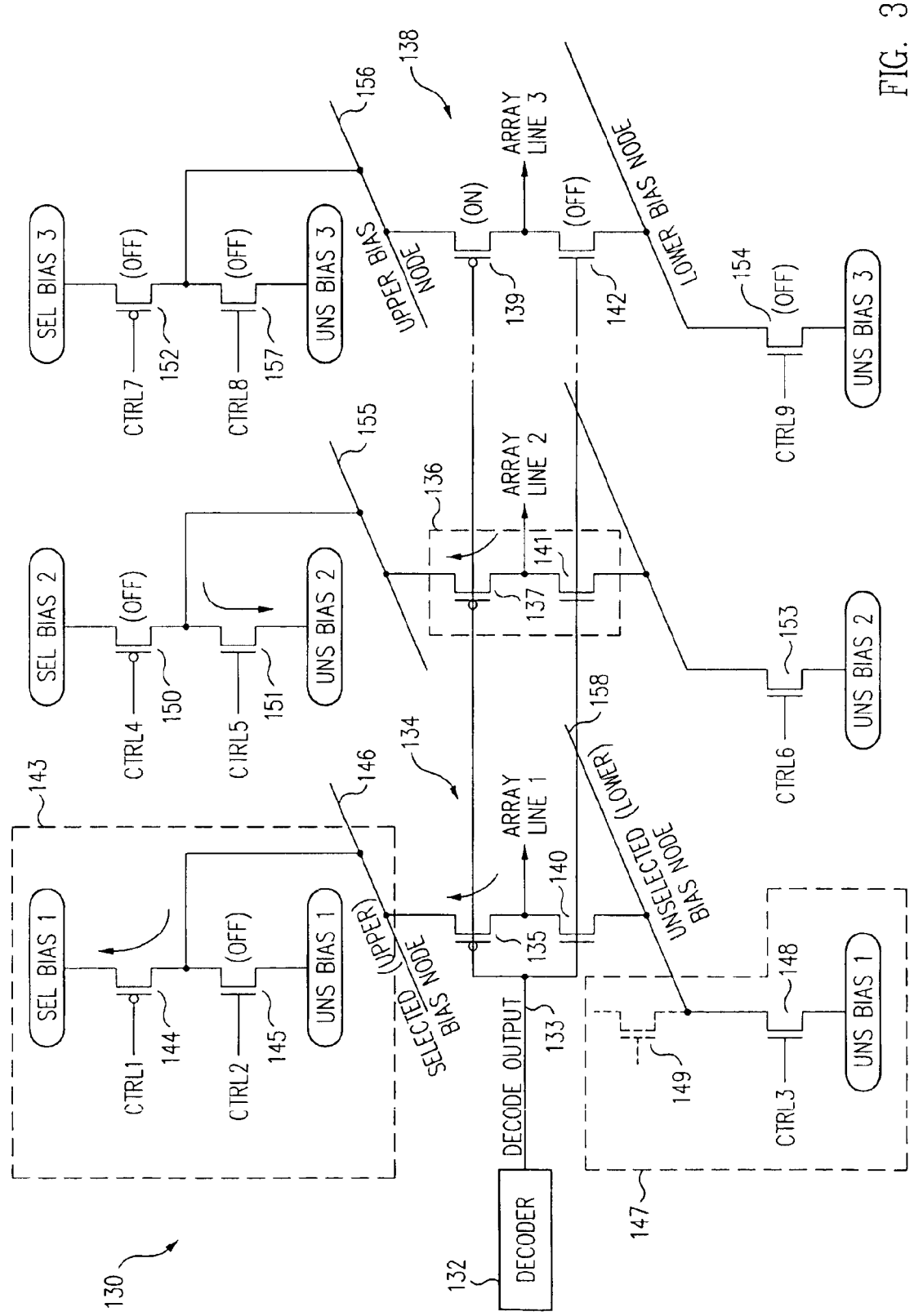
FIG. 3 is an electrical schematic diagram representing a multi-headed decoder circuit in accordance with an embodiment of the present invention.

FIG. 3 is an electrical schematic diagram representing a multi-headed decoder circuit in accordance with an embodiment of the present invention as might be incorporated within the row circuits block 104 or the column circuits block 106. A group of three array lines are shown, labeled ARRAY LINE 1, ARRAY LINE 2, AND ARRAY LINE 3, as might represent word lines within the memory array. A decoder circuit 132 generates a decode output signal (also termed a "decoded" output signal) conveyed on node 133 to a group of "heads" 134, 136, 138 for the decoder. While shown here as three such heads, greater or lesser numbers of heads may be employed, and numbers equal to an integer power of two are more convenient and therefore preferred. Such a head may also be called an array line driver. Three such heads are shown here to emphasize three particular situations in which an array line may be driven by such a driver, although greater numbers of such array line drivers are preferred, as hereinafter described.

Array line driver 134 includes a PMOS transistor 135 and an NMOS transistor 140 arranged in an inverter type of structure. Assuming the decode output 133 is active (i.e., selected, and in this case at a low voltage), transistor 135 is turned on, which couples its associated ARRAY LINE 1 to the source node of the PMOS transistor 135, which may be termed a SELECTED BIAS NODE, also labeled 146. Colloquially, transistor 135 drives its output node ARRAY LINE 1 "up" to the bias voltage present on the corresponding SELECTED BIAS NODE 146 when the decode output 133 is active. A selected bias generator circuit 143 receives two control signals CTRL1 and CTRL2 and generates the SELECTED BIAS NODE 146 accordingly. As shown, CTRL1 is assumed to be active and CTRL2 is inactive, thus the PMOS transistor 144 is conductive and drives the corresponding SELECTED BIAS NODE 146 to a selected bias potential SEL BIAS 1, while transistor 145 remains off. Such a selected bias potential SEL BIAS 1 may be generated on-chip by internal circuits (not shown), or received from an external source of voltage off-chip. The role of the two control nodes CTRL1 and CTRL2, as well as additional embodiments of such selected bias generator circuits, is described in greater detail herebelow. In a preferred embodiment, the selected bias voltage SEL BIAS 1 may be approximately 11.0 volts during a write operation (i.e. programming operation) and may be approximately 2.4 volts during a read operation, although many other choices may be desirable, depending on the array technology chosen.

Array line driver 136 includes a PMOS transistor 137 and an NMOS transistor 141. Again assuming the decode output 133 is active, transistor 137 is turned on, which couples its associated ARRAY LINE 2 to the associated SELECTED BIAS NODE 155 to which the source of PMOS transistor 137 is coupled. A second selected bias generator circuit includes transistors 150 and 151, and receives two control signals CTRL4 and CTRL5 and generates the SELECTED BIAS NODE 155 accordingly. As shown, CTRL4 is assumed to be inactive and CTRL5 is active, thus the PMOS transistor 150 is off, and transistor 151 is conductive and drives the corresponding SELECTED BIAS NODE 155 to an unselected bias potential UNS BIAS 2. Such an unselected bias potential UNS BIAS 2 may be generated on-chip by internal circuits (not shown), or received from an external source of voltage off-chip.

As before, transistor 137 may be viewed as driving its ARRAY LINE 2 output node "up" to the bias voltage present on the corresponding SELECTED BIAS NODE labeled 155. Such a view results from historical behavior of inverter-like circuits in which the PMOS device (e.g., transistor 137) usually pulls the output node high. Consequently, a selected bias node may also be referred to as an "upper bias node." However, the voltage to which the PMOS device 137 drives does not necessarily need to be a high voltage. For example, the unselected bias voltage UNS BIAS 2 may be nearer to ground than to VDD. As long as its voltage is above ground by at least as much as the PMOS threshold voltage, the PMOS device 137 will be conductive and will be able to drive the voltage of its output node ARRAY LINE 2 to the UNS BIAS 2 voltage. In a preferred embodiment, the unselected bias voltage UNS BIAS 2 may be approximately 0.9–1.0 volts during a write operation (i.e. programming operation) and may be approximately 0.4–0.5 volts during a read operation, and the PMOS threshold voltage may be approximately 0.3+/−0.2 volts, although many other choices may be desirable, depending on the array technology chosen. If the unselected bias voltage UNS BIAS 2 is less than the PMOS threshold voltage, the circuit arrangement is still useful to discharge an array line from a higher voltage down to a voltage equal to ground plus the PMOS threshold voltage, and thus can ensure than no unselected array line remains at a high voltage. However, the array driver 136 would be unable to drive its ARRAY LINE 2 up from ground to the associated unselected bias voltage UNS BIAS 2 unless the PMOS threshold voltage is less than the unselected bias voltage UNS BIAS 2.

A third condition is also available from this circuit arrangement when the decode output 133 is selected (i.e., active). Array line driver 138 includes a PMOS transistor 139 and an NMOS transistor 142, again arranged in an inverter type of structure. Transistor 139 is turned on because the decode output 133 is active, which couples its associated ARRAY LINE 3 to the upper bias node 156. A third "upper bias" generator circuit includes PMOS transistor 152 and NMOS transistor 157 which are responsive respectively to control signals CTRL7 and CTRL8. As shown, both CTRL7 and CTRL8 are assumed to be inactive, thus both transistors 152 and 157 are off, leaving the upper bias node 156 in a floating state.

An unselected bias generator circuit 147 is shown, including an NMOS transistor 148 which is responsive to a control signal CTRL3. In another situation (not depicted in FIG. 3) in which the decode node 133 is not selected (e.g., when inactive, in this case at a high voltage), then transistor 140 will be turned on and transistor 135 turned off, and the ARRAY LINE 1 is driven to the UNSELECTED BIAS NODE 158, which may also be termed the "lower bias node" 158. If the control signal CTRL3 is active, then this UNSELECTED BIAS NODE 158 is coupled to the unselected bias voltage UNS BIAS 1. In this case, an array line which is associated with an unselected decode node is driven to the unselected bias voltage. As described above, a different array line which is associated with a selected decode node may also be driven to the unselected bias voltage if the upper bias circuit drives the associated upper bias node to the unselected bias voltage (e.g., UNS BIAS 1).

If the control signal CTRL3 is inactive, then the UNSELECTED BIAS NODE 158 is floating, and the array lines associated with an unselected decode node are driven to a floating node, and thus are collectively floating themselves.

As may be appreciated, the decoder circuit 130 allows each array line to be driven by its associated array driver circuit, when its associated decode node is selected, to a selected bias voltage, to an unselected bias voltage, or to a floating potential, each corresponding to the associated array driver circuit. The decode circuit 130 further allows each array line to be driven by its associated array driver circuit, when its associated decode node is unselected, to an unselected bias voltage or to a floating potential corresponding to the associated array driver circuit. The desirability of such biasing options for each array line, including coupling an array line to a floating state, is further described in the aforementioned U.S. patent application Ser. No. 09/897,705 entitled "Three-Dimensional Memory Array Incorporating Serial Chain Diode Stack."

Figure 4:
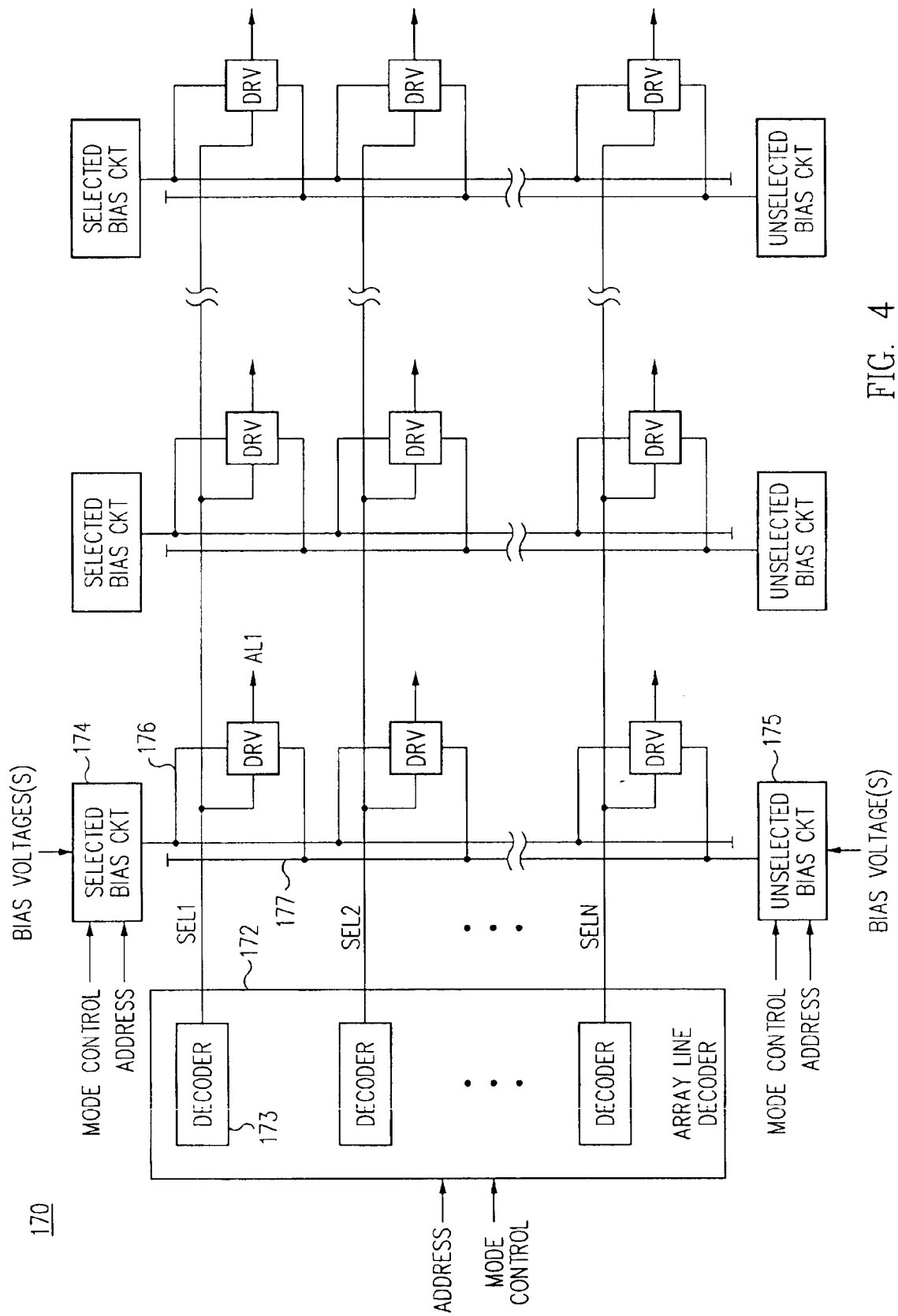
FIG. 4 is a block diagram representing a multi-headed decoder circuit in accordance with an embodiment of the present invention.

Referring now to FIG. 4, a block diagram is shown of a multi-headed array line decoder circuit, such as might be found in row circuits block 104 shown in FIG. 1 for driving word lines, and which also represents an embodiment of the decoder just described above in reference to FIG. 3. While such an arrangement is believed to be particularly beneficial for three-dimensional memory arrays (i.e., having more than one plane of memory cells), such an arrangement is also beneficial for any memory array having extremely dense array line pitch, even if a traditional two-dimensional array having only one plane of memory cells.

A group of array lines, such as AL1, are shown, here representing word lines of the memory array. Each is driven by a respective array driver circuit, such as DRV. An array line decoder circuit 172 receives a group of address signals and possibly one or more mode control signals, such as for controlling read mode or write mode of the array, and generates a 1-of-N decode on its outputs (several of which are shown and labeled SEL1, SEL2, . . . , SELN), one of which (at most) is selected (i.e., driven to an active level) and the remaining ones are unselected. Each such decode output is generated by an individual decoder circuit or portion of a decoder circuit, indicated as decoder 173, and is coupled to an associated plurality of driver circuits DRV for driving an associated plurality of array lines. Each decode output signal (e.g., SEL1) couples, when selected, a group of associated array lines (e.g., one of which is labeled AL1) respectively to corresponding selected bias nodes (e.g., one of which is labeled node 176), and couples, when unselected, the group of associated array lines respectively to corresponding unselected bias nodes (e.g., one of which is labeled node 177).

A group of selected bias circuits, such as 174, are also shown. In various embodiments, each may receive a group of address signals, one or more mode control signals, and one or more bias voltages. For example, in a three-dimensional memory array, the selected bias circuit 174 may be associated only with array lines within a particular array line layer of the memory array. The bias voltages received by the selected bias circuit 174 preferably include a bias voltage (or other bias condition) suitable for a selected array line on such array line layer, and also include another bias voltage (or other bias condition) suitable for non-selected array lines on such array line layer. Bias voltages for both a read mode and a write mode may be received, with the mode control signals configured to select the appropriate set. Alternatively, the bias voltages may be generated by another circuit (not shown) which generates a selected bias voltage for the layer, and also an unselected bias voltage for the layer, with such bias voltages being generated appropriately depending on whether the array is reading or writing.

The selected bias circuits, such as 174, also preferably receive a group of address signals to further determine the particular bias condition impressed on the associated selected bias node, such as node 176. For example, the desired selected bias condition may depend upon whether the particular array line layer associated therewith is associated with a selected memory plane (and potentially whether the selected memory plane is above or below the array line layer), whether the particular array line layer associated therewith is adjacent to a selected memory plane, or whether the particular array line layer associated therewith is neither. It is expected that at least two such selected bias circuits are implemented, but the number of such selected bias circuits need not match the number of array driver circuits associated with a given decode node. For example, if two or more array lines are selected simultaneously, both respective selected array drivers may be coupled to the same selected bias circuit.

A group of unselected bias circuits, such as 175, are also shown. In various embodiments, each receives a group of address signals, one or more mode control signals, and one or more bias voltages. For example, in a three-dimensional memory array, the unselected bias circuit 175 may be associated only with array lines within a particular array line layer of the memory array. The bias voltages received by the unselected bias circuit 175 preferably include a bias voltage (or other bias condition) suitable for a nonselected array line on such array line layer. Unselected bias voltages for both a read mode and a write mode may be received, with the mode control signals configured to select the appropriate set. Alternatively, the individual bias voltages may be generated by another circuit (not shown) which generates a common unselected bias voltage for the layer which is generated appropriately depending on whether the array is reading or writing.

The unselected bias circuits, such as 175, also preferably receive a group of address signals to further determine the particular bias condition impressed on the associated unselected bias node, such as node 177. For example, the desired unselected bias condition may depend upon whether the particular array line layer associated therewith is associated with a selected memory plane (and potentially whether the selected memory plane is above or below the array line layer), whether the particular array line layer associated therewith is adjacent to a selected memory plane, or whether the particular array line layer associated therewith is neither. The desired unselected bias condition may be an unselected bias voltage suitable for a read mode, an unselected bias voltage suitable for a write mode, a floating condition, or an inactive array bias voltage suitable for the particular array lines, such as a ground potential. Such various possible bias conditions may be chosen based upon the address signals received, the mode control signals received, or a combination of both types of signals received by a given unselected bias circuit 175. It is expected that at least two such unselected bias circuits are implemented, but the number of such unselected bias circuits need not match the number of array driver circuits associated with a given decode node. For example, the respective array drivers for all array lines on the same layer (e.g., of the same sub-array) may be coupled to the same unselected bias circuit, whether at most only one such array line is selected at a time, or even if two or more array lines are simultaneously selected.

In certain alternative embodiments, the unselected bias circuits 175 may be as simple as a connection to a source of the unselected bias voltage (or other bias condition) appropriate for the mode of interest (e.g., read, write, inactive sub-array, etc.). For example, in a memory array whose unselected array lines always are to be driven to the same potential, regardless of which memory array layer such lines may be located within, there may not be any distinction between the various unselected bias nodes serving the various array line drivers. In other embodiments, a respective unselected bias circuit may be implemented for up to each respective layer, and the particular bias voltage applied to a given layer may be more optimally adjusted for that given layer, or adjusted for each memory level, as described more fully in co-pending U.S. application Ser. No. 10/307, 270 entitled "Integrated Circuit and Method for Selecting a Set of Memory-Cell-Layer-Dependent or Temperature-Dependent Operating Conditions", filed on even date herewith, which application is hereby incorporated by reference.

Figure 5:
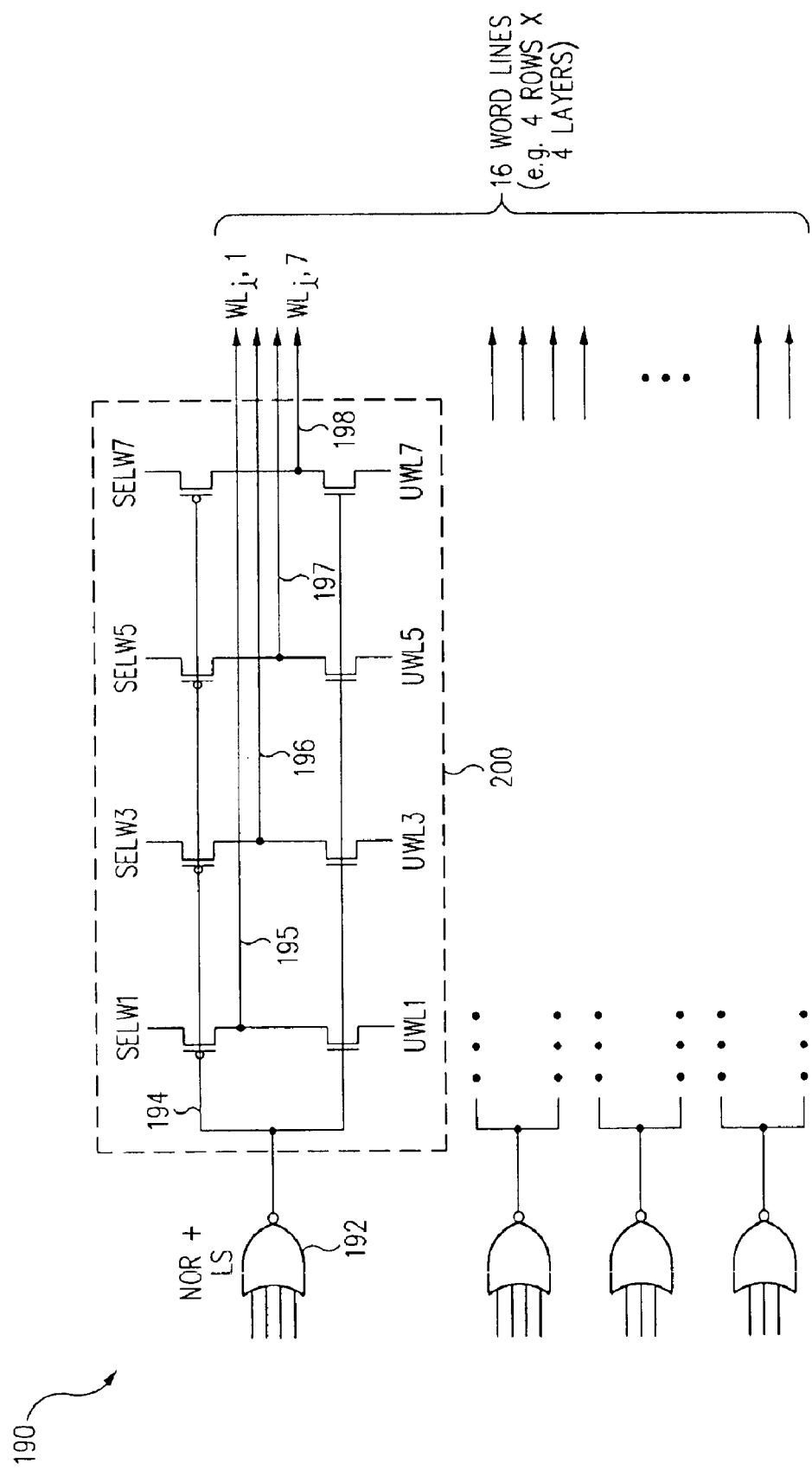
FIG. 5 is an electrical schematic diagram of a multi-headed decoder circuit supporting a group of sixteen word lines in accordance with an embodiment of the present invention.

In the several figures that follow, a variety of different configurations of multi-headed decoders are shown and described which utilize different numbers of decoder heads, different numbers of selected (upper) bias circuits, and different numbers of unselected (lower) bias circuits, as well as other variations. Referring now to FIG. 5, a schematic diagram is shown representing a portion of a word line decoder circuit. Four different four-headed decoders are shown, which together support 16 word lines. Such word lines are preferably arranged as 4 word lines exiting to a given side of an array on each of 4 memory array layers, although other arrangements are contemplated as well. Each decoder circuit includes a NOR gate 192 which generates the decode node 194. As used here, the NOR gate 192 is included to represent the entire decoder circuit, including any pre-decoder circuitry, and any level-shift circuitry which may also be present, which collectively are employed to generate a decode node coupled to more than one array line driver circuit (i.e., multiple heads). Preferable decoder circuits are more fully described in co-pending U.S. application Ser. No. 09/897,771, filed on Jun. 29, 2001, entitled "Method and Apparatus for Biasing Selected and Unselected Array Lines When Writing a Memory Array", by Roy E. Scheuerlein, published on Sep. 26, 2002 as U.S. patent application Ser. No. 20020136047 A1, and in the aforementioned "Three-Dimensional Memory Array Incorporating Serial Chain Diode Stack" by Kleveland, et al, U.S. patent application Ser. No. 09/897,705.

The decode node 194 is coupled to each of four array drivers within the driver "quad" 200, each for driving a respective array line, here shown as a respective word line. The decode node of each of the other three decoder circuits is respectively coupled to the four array drivers within a respective driver quad, to drive the other twelve word lines. Each respective array driver circuit within a given quad 200 has its own selected bias node (e.g., SELW1) and its own unselected bias node (e.g., UWL1). For example, word line 195 is driven to either its associated selected bias node SELW1 or its associated unselected bias node UWL1. Similarly, word lines 196, 197, and 198 are driven respectively to either its associated selected bias node SELW3, SELW5, and SELW7 or its associated unselected bias node UWL3, UWL5, and UWL7. The terminology used in this example is suggestive of a preferred embodiment in which each word line of a quad array driver circuit is located on a different array line layer of the memory array. All four such word lines may be considered part of the same row, but each is located on a respective layer, such as layer 1, 3, 5, and 7 of the array (e.g., layers L1, L3, L5, and L7 of an eight-plane memory array such as that depicted in FIG. 2).

Figure 6:
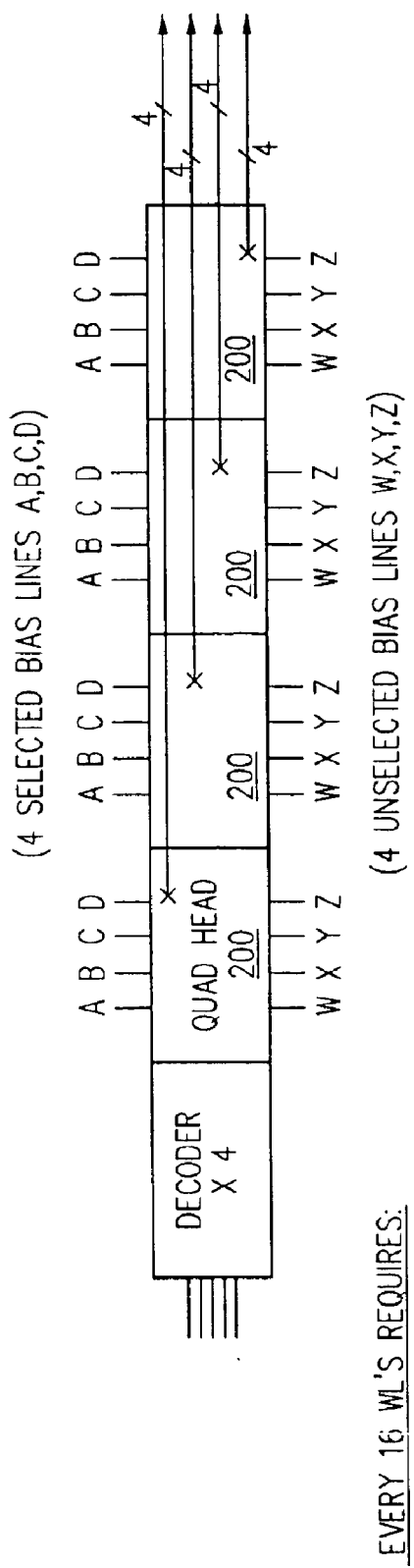
FIG. 6 is a diagram representing an exemplary physical layout arrangement of the multi-headed decoder shown in FIG. 5.

Referring now to FIG. 6, a possible layout organization is depicted for the decoder circuit shown in FIG. 5. To simplify such a block diagram, the various selected (upper) bias nodes have been labeled A, B, C, and D, while the various unselected (lower) bias nodes have been labeled W, X, Y, and Z. The four instantiations (i.e., "placements") of the array driver quad 200 are shown placed horizontally in an end-to-end arrangement (i.e., arranged in four "banks"), with the decoder circuits (e.g., NOR gate 192) placed to the left side. Each quad 200 receives the same four selected bias nodes A, B, C, and D, and the same unselected bias nodes W, X, Y, and Z. Each drives four word lines, shown exiting to the right of the layout structure, for a total of sixteen such word lines.

In an exemplary embodiment of a three-dimensional memory array having eight memory planes, the sixteen word lines are preferably arranged as four word lines exiting to one side of the memory array on each of four word line layers. As described in greater detail herebelow, the word lines on each layer may be inter-digitated, with the even-numbered word lines exiting to one side of the array and the odd-numbered word lines exiting to the other side of the array. The total lateral distance required for this group of word lines exiting to the one side of the array may be as small as 4.0 $\mu$ (e.g., 0.5 $\mu$ true word line pitch in the array, resulting in a 1.0 $\mu$ effective word line pitch for word lines exiting to one side of the array, times four word lines). Nonetheless, for the arrangement shown, four decoders 192 are required for every group of sixteen word lines. In addition, since each head is controlled by its own bias generator circuits, four different circuits are required to generate the four different selected bias nodes A, B, C, and D, and four different circuits are also required to generate the four different unselected bias nodes W, X, Y, and Z. Accomplishing a group of four decoders 192 on such a small effective pitch is extremely difficult, and results in a very wide layout, if achievable at all. Moreover, routing the four decode nodes out to the four quads 200 results in significant wiring congestion. This approach reduces the number of "external" control circuits (i.e., outside the pitched requirement of the word lines) but at the expense of a large number of decoder circuits that must interface with the pitched word lines of the array. This arrangement may be termed a four-headed, four bank configuration.

Figure 7:
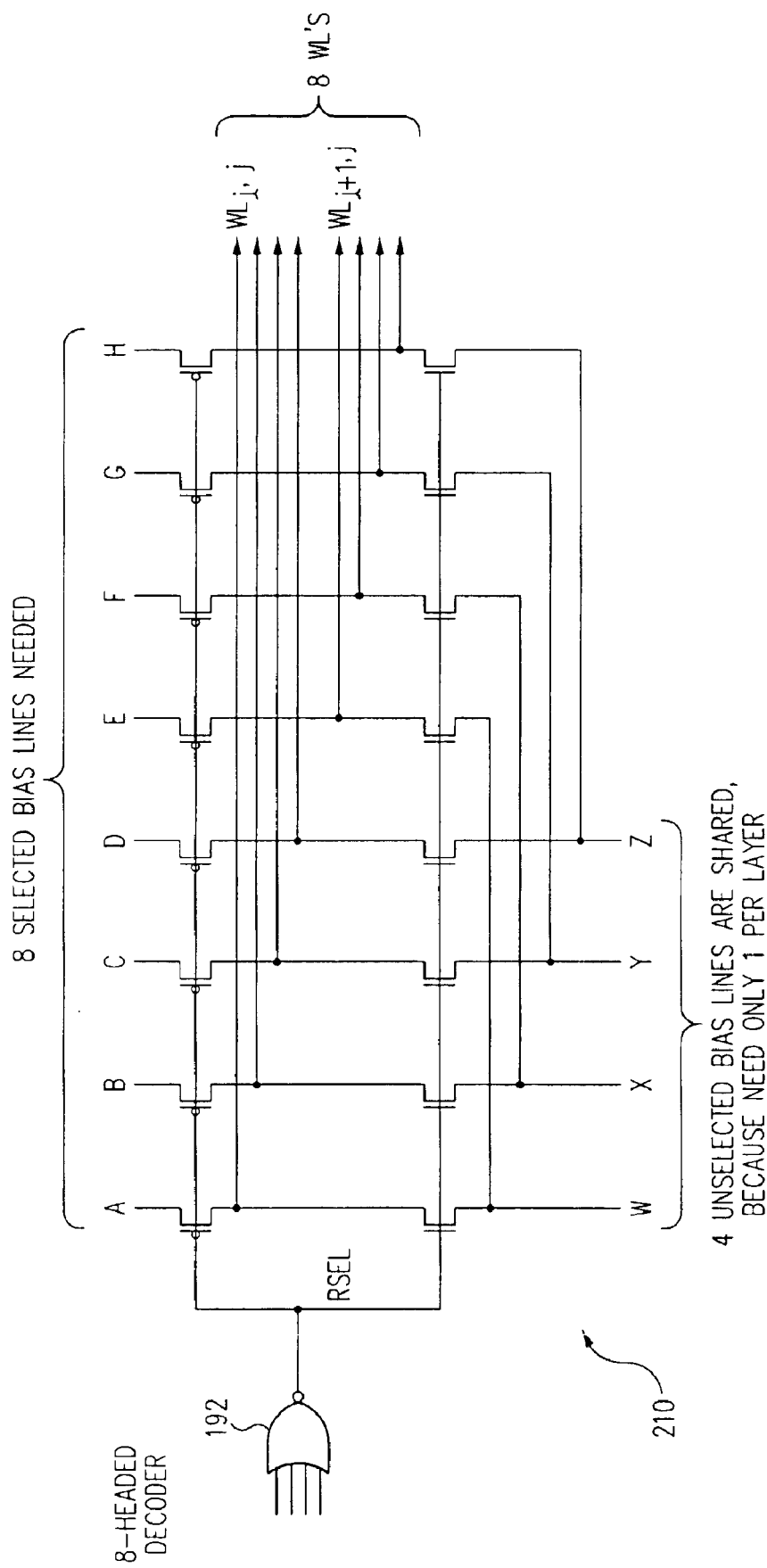
FIG. 7 is an electrical schematic diagram of a multi-headed decoder circuit supporting a group of sixteen word lines in accordance with an embodiment of the present invention.

In an alternative arrangement, as depicted in FIG. 7, an eight-headed decoder is provided. Since each decode node drives eight array line driver circuits (collectively labeled 210), a total of eight different selected bias nodes A, B, C, D, E, F, G, and H are provided so that only one of the eight associated word lines is selected, with the other seven word lines (having a selected decode node RSEL) driven to an unselected bias voltage by way of its associated upper (selected) bias node. However, since each unselected decode node drives its eight associated word lines to an appropriate unselected bias node, only four such unselected bias nodes W, X, Y, and Z are needed because all unselected word lines on a given memory array layer are preferably driven to the same bias condition. Such a condition may be a floating state, or may be a particular unselected bias voltage for the memory array layer which is a function of the position of the layer relative to the selected layer. As depicted in the figure, a pair of array driver circuits share the same unselected bias node W. Each of the pair drives a word line on the same memory layer. One is labeled $WL_{i,j}$ to indicate word line i on layer j, while the other is labeled $WL_{i+1,j}$ to indicate word line i+1 on layer j.

Figure 8:
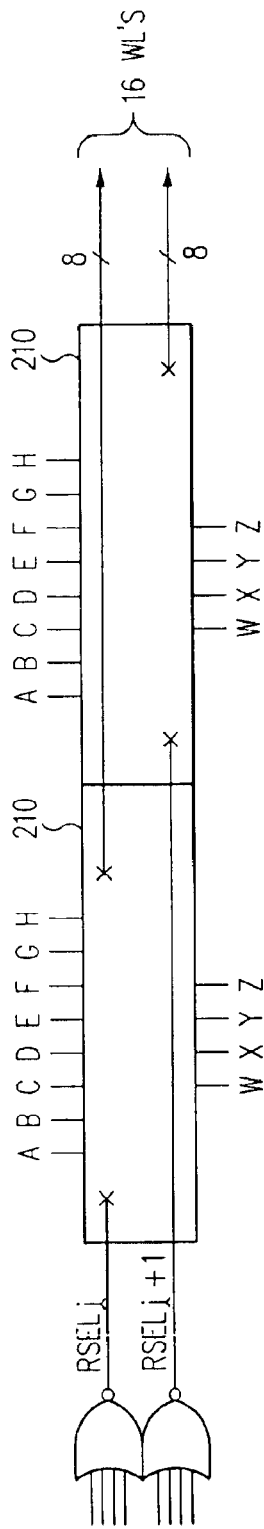
FIG. 8 is a diagram representing an exemplary physical layout arrangement of the multi-headed decoder shown in FIG. 7.

Referring now to FIG. 8, an exemplary layout organization is depicted for the decoder circuit 210 shown in FIG. 7. Two instantiations of the array driver group 210 are shown placed horizontally in an end-to-end arrangement (i.e., arranged in two "banks"), with the decoder circuits (e.g., NOR gate 192) placed to the left side. Each driver group 210 receives the same eight selected bias nodes A, B, C, D, E, F, G, and H and the same four unselected bias nodes W, X, Y, and Z. Each drives eight word lines, shown exiting to the right of the layout structure, for a total of sixteen word lines.

In this arrangement, only two decoders 192 are required for every group of sixteen word lines. However, eight different bias circuits are now required to generate the eight different selected bias nodes A, B, C, D, E, F, G, and H, but only four circuits are required to generate the four different unselected bias nodes W, X, Y, and Z. Only two decoders 192 need be interfaced to the pitch of 16 word lines, and only two decode nodes $RSEL_i$ and $RSEL_{i+1}$ need be routed out to the driver groups 210. This approach increases the number of "external" control circuits to be able to cut in half the number of decoder circuits that must interface with the group of sixteen tightly pitched word lines of the array. This arrangement may be termed an eight-headed, two-bank configuration.

Figure 9:
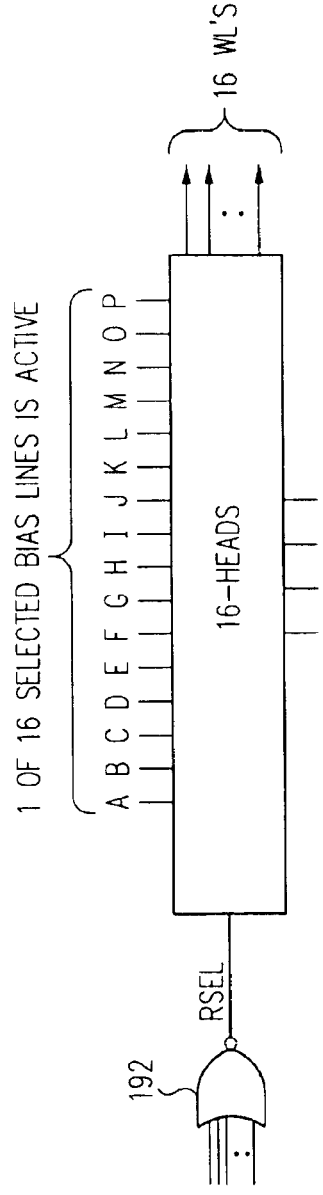
FIG. 9 is a diagram representing an exemplary physical layout arrangement of another embodiment of the present invention.

In another alternative arrangement, as depicted in FIG. 9, a sixteen-headed decoder is provided. A total of sixteen different selected bias nodes A, B, C, . . . , O, and P are provided so that only one of the sixteen associated word lines is selected at a time, with the other fifteen word lines (having a decode node RSEL which is selected) driven to an unselected bias condition by way of its associated upper bias node. In other words, only one of the sixteen selected bias nodes is actually driven to the selected bias voltage, while the other fifteen selected bias nodes are driven to an appropriate unselected bias voltage (or other condition) for its associated layer. Still, only four unselected bias nodes W, X, Y, and Z are needed because all unselected word lines on a given memory array layer are preferably driven to the same bias condition. In other words, the four unselected bias nodes are respectively driven to an appropriate unselected bias condition for its associated layer. One placement of the array driver group is placed horizontally next to its associated decoder circuit (e.g., NOR gate 192) and drives sixteen word lines, shown exiting to the right of the layout structure.

In this arrangement, only one decoder 192 is now required for every group of sixteen word lines. However, sixteen different bias circuits are now provided to generate the sixteen different selected bias nodes A, B, C, . . . , O, and P, but still only four bias circuits are required to generate the four different unselected bias nodes W, X, Y, and Z. Only one decoder 192 needs to interface to the pitch of 16 word lines, and only one decode node $RSEL_i$ needs be routed from the decoder circuit area (which is preferably located beneath the array) out to the array drivers. This approach increases the number of "external" control circuits to 20 (i.e., 16 selected bias circuits and 4 unselected bias circuits) in order to reduce the number of decoder circuits that must interface with the group of sixteen tightly pitched word lines of the array to a single such decoder. This arrangement may be termed a sixteen-headed, one-bank configuration.

In a preferred embodiment, the sixteen-headed one-bank decoder supports four array lines exiting to one side of the memory array, on each of four memory array layers having array lines exiting to that same side. The four array lines on a given layer are preferably adjacent lines as they exit the array. If inter-digitated array lines are employed (i.e., even-numbered array lines exiting to one side, odd-numbered array lines exiting to the other side), such adjacent memory lines exiting to one side of the array may actually represent every other array line within the memory array itself.

Figure 10:
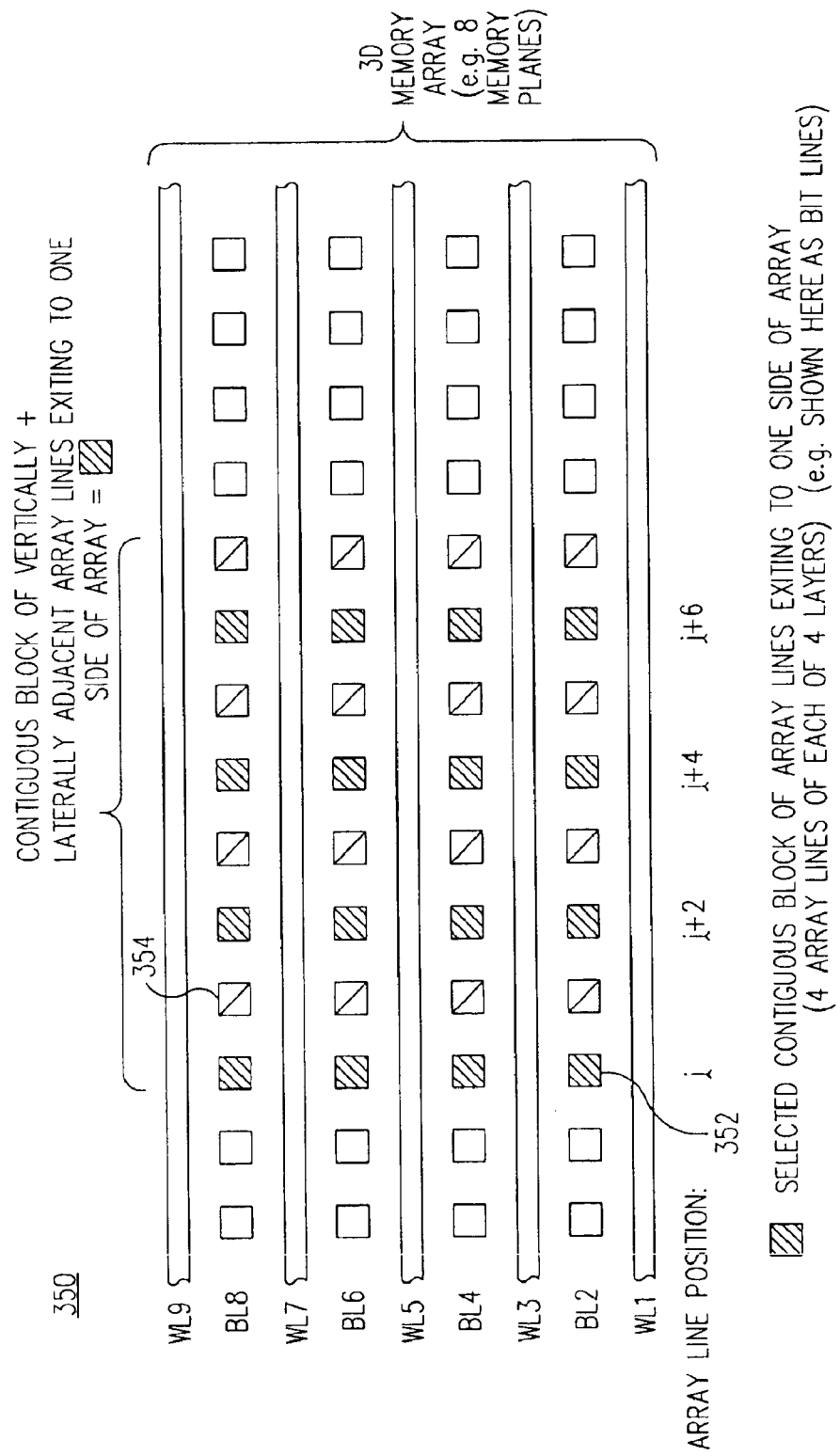
FIG. 10 is a cross-sectional diagram depicting a contiguous block of array lines as simultaneously selected by a decoder circuit in accordance with an embodiment of the present invention.

The array lines on each layer may be shared by a memory plane above the layer and by another memory plane below the layer. FIG. 10 depicts a cross sectional representation of a three-dimensional memory array having eight memory planes, each formed vertically between a word line layer (e.g., WL1, WL3, WL5, WL7, WL9) and an adjacent bit line layer (e.g., BL2, BL4, BL6, BL8), as described hereinabove. The array lines on each layer are preferably inter-digitated, with every other array line exiting the array to one side of the array, and the remaining half of the array lines exiting the array to the side opposite the one side. For example, bit lines i, i+2, i+4, and i+6 on each of the BL2, BL4, BL6, BL8 layers exit to one side of the array. This group of sixteen array lines represents a contiguous block of vertically and laterally adjacent array lines of those array lines exiting to one side of the array. Similarly, bit lines i+1, i+3, i+5, and i+7 on each of the BL2, BL4, BL6, BL8 layers exit to the other side of the array. This additional group of sixteen array lines also represents another contiguous block of vertically and laterally adjacent array lines of those array lines exiting to the other side of the array. The word lines on the top-most and bottom-most layers are electrically connected together, thus there are also four layers of word lines WL1, WL3, WL5, and WL7, exhibiting preferably a similar arrangement.

Figure 11:
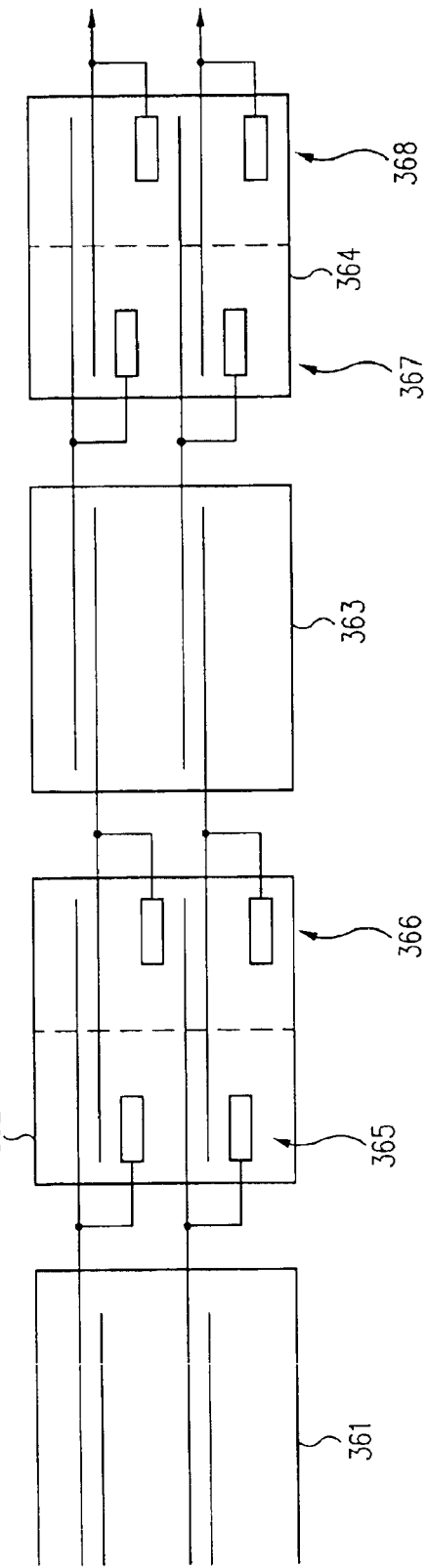
FIG. 11 is a block diagram depicting multiple sub-arrays of an integrated circuit, having word lines shared by two adjacent sub-arrays and driven by a decoder circuit located beneath one of the sub-arrays.

A block diagram view of an exemplary memory array is depicted in FIG. 11, which shows four sub-arrays 361, 362, 363, and 364 of a larger array. Assume that each sub-array includes eight memory planes which are served by 1024 word lines on each of 4 layers. For each sub-array, half the word lines exit to the left, and the other half exit to the right. For the memory sub-array 362, half of the word lines exit to the left side of the array and are served by decoders 365 disposed beneath the left side of array. The other half of the word lines exit to the right side of the array, and are served by decoders 366 disposed beneath the right side of memory array. In the configuration shown, each word line generated by the group of decoders 365 is shared by both the sub-array 361 (which may be termed the "outboard" array) and the sub-array 362 (which may be termed the "inboard" array). Likewise, each word line generated by the group of decoders 366 is shared by both the inboard sub-array 362 and the outboard sub-array 363.

In a similar fashion, half of the word lines exit to the left side of sub-array 364 and are served by decoders 367 disposed beneath the left side of the array. The other half of the word lines exit to the right side of the sub-array 364, and are served by decoders 367 disposed beneath the right side of the memory array. Each word line generated by the group of decoders 367 is shared by both the inboard sub-array 364 and the outboard sub-array 363. Likewise, each word line generated by the group of decoders 368 is shared by both the inboard sub-array 364 and an outboard sub-array to the right (not shown).

By sharing word lines between two sub-arrays, word line decoder circuits are not necessary beneath sub-array 361 or 363, and such space may be utilized by bit line decode and sense circuits. This allows the row and column decoder circuits to be arranged in a checkerboard fashion, as is described in greater detail in co-pending U.S. application Ser. No. 09/896,814, filed on Jun. 29, 2001, entitled "Memory Device with Row and Column Decoder Circuits Arranged in a Checkerboard Pattern under a Plurality of Memory Arrays," which application was published on Sep. 26, 2002 as U.S. patent application Ser. No. 20020136045 A1, and which application is hereby incorporated by reference.

Such a shared word line arrangement may result in power dissipation, particularly during a write or programming operation, which is unacceptably high. For example, with certain memory array technologies, such leakage may be caused when a selected word line and many unselected word lines are driven to respective programming bias conditions when no bit line is selected in the array. This leakage current may exceed desired limits when two arrays are both placed in a leakage condition.

Figure 12:
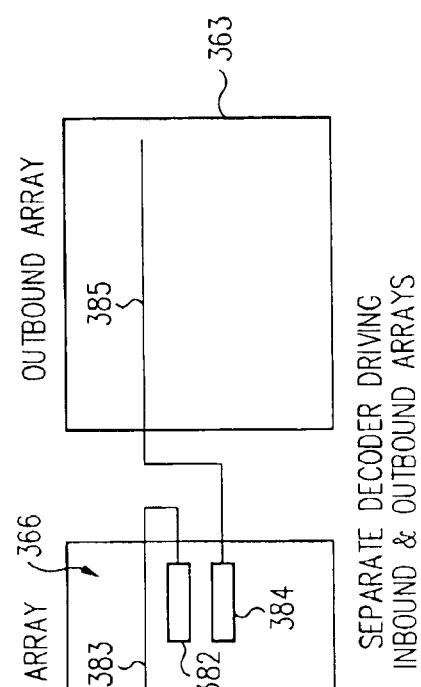
FIG. 12 is a block diagram depicting multiple sub-arrays of an integrated circuit, having separate word lines for two adjacent sub-arrays, each driven by a decoder circuit located beneath one of the two adjacent sub-arrays.

To reduce such leakage current, the word lines in each sub-array may be driven independently, as depicted in FIG. 12. A decoder circuit 382 drives a group of word lines 383 serving the sub-array 362, while a decoder circuit 384 drives a group of word lines 385 serving the adjacent sub-array 363. Nonetheless, both decoder circuits 382, 384 are preferably placed beneath the right side of sub-array 362, as before. Although this appears to require a 2× increase in the number of decoder circuits, the multi-headed decoder circuits described above may be employed to accomplish such non-shared decoders and still meet exceedingly tight word line pitch requirements.

Figure 13:
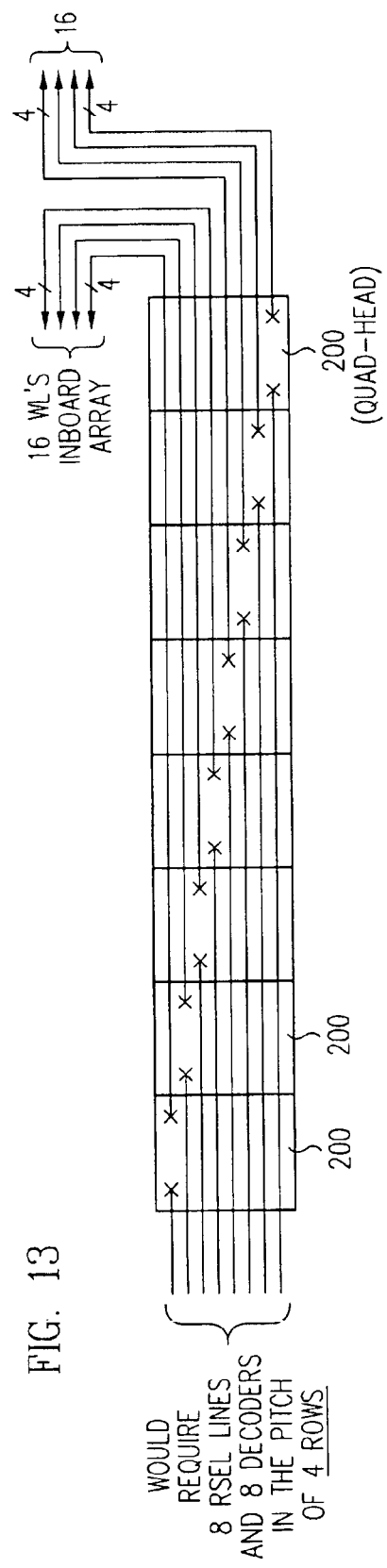
FIG. 13 is a diagram representing an exemplary physical layout arrangement of a four-headed decoder circuit supporting a group of sixteen word lines within an inboard array and a group of sixteen word lines within an outboard array.

A layout diagram of such an inboard/outboard decoder arrangement using four-headed decoders is depicted in FIG. 13. Eight banks of driver quads 200 would be required to generate the sixteen inboard word lines and sixteen outboard word lines. Eight decode nodes would be required to route from the row decoder area (to the left) into and generally across the driver circuits area. Accomplishing such routing in the pitch of four word lines may be very difficult, depending upon the word line pitch of the memory array.

Figure 14:
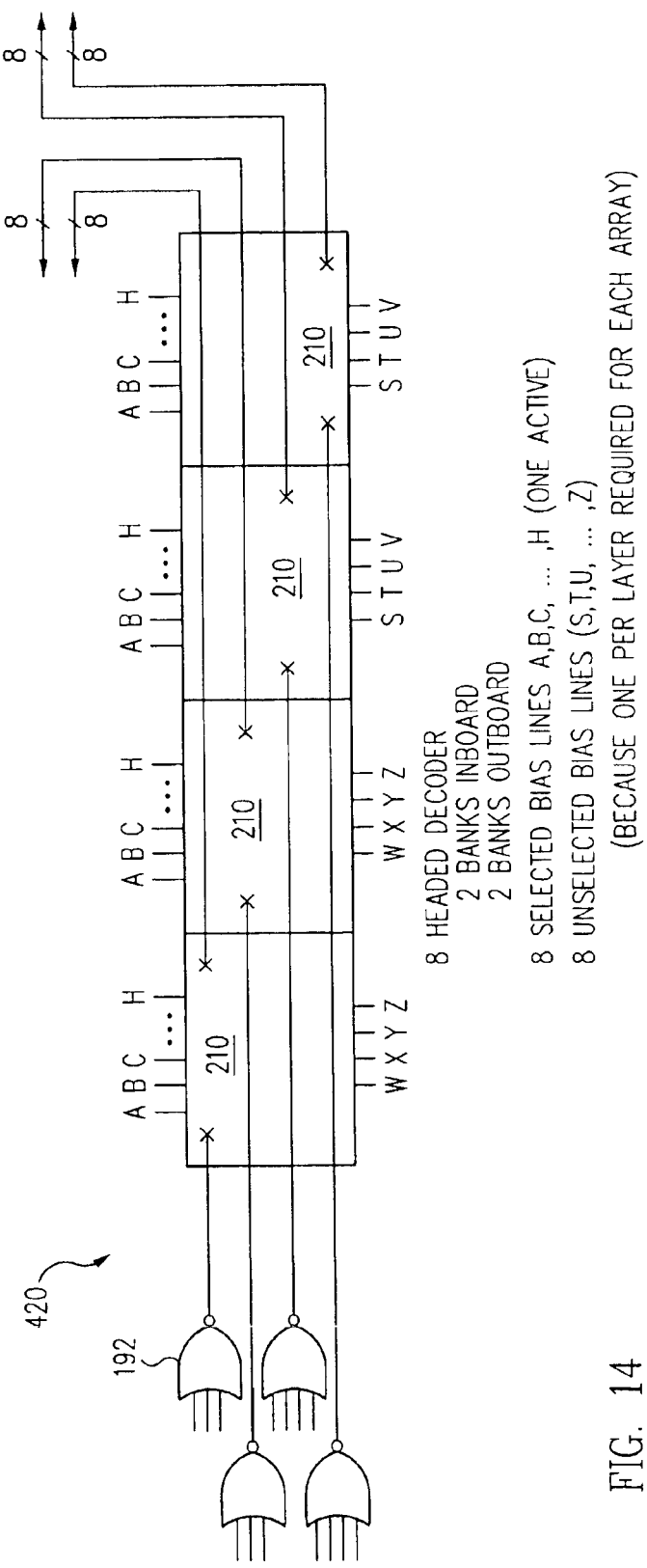
FIG. 14 is a diagram representing an exemplary physical layout arrangement of an eight-headed decoder circuit supporting a group of sixteen word lines within an inboard array and a group of sixteen word lines within an outboard array.

Referring now to FIG. 14, an alternate arrangement 420 is shown which utilizes eight-headed decoders arranged in four banks, with two banks for inboard word lines and two banks for outboard word lines. A total of eight different upper (selected) bias nodes A, B, C, D, E, F, G, and H are provided for each bank so that only one of the eight associated word lines is selected, with the other seven word lines (associated with the same selected decode node RSEL) driven to an unselected bias condition by way of its associated upper bias node. Four unselected bias nodes W, X, Y, and Z are shared by the two inboard banks, because all unselected word lines on a given memory array layer of a given memory array are preferably driven to the same bias condition. As before, such a condition may be a floating state, or may be a particular unselected bias voltage for the memory array layer which may be a function of the position of the layer relative to the selected layer, or may be an inactive bias condition for an unselected sub-array. Each of the inboard banks drives eight word lines, shown exiting to the right of the layout structure, for a total of sixteen inboard word lines.

Four additional unselected bias nodes S, T, U, and V are shared by the two outboard banks. These are generated separately from the unselected bias nodes for the inboard banks because the unselected word lines in the outboard memory array may be driven to bias conditions different than the unselected word lines of the inboard memory array. For example, one of the sub-arrays may be inactive. Each of the outboard banks drives eight word lines, shown exiting to the right of the layout structure, for a total of sixteen outboard word lines. In this arrangement, four decoders 192 are required for every group of sixteen inboard and sixteen outboard word lines. Eight different bias circuits are required to generate the eight different selected bias nodes A, B, C, D, E, F, G, and H, and eight circuits are required to generate the eight different unselected bias nodes S, T, U, V, W, X, Y, and Z. Four decoders 192 are interfaced to the pitch of 16 word lines, and four decode nodes are routed out to the array line driver groups 210. The selected bias nodes A, B, C, D, E, F, G, and H may be shared across the inboard and outboard banks because separate decoders control the inboard versus the outboard banks. Alternatively, absent concerns about additional power dissipation, both inboard and outboard arrays may both be simultaneously activated, thus allowing fewer numbers of unselected bias nodes. For example, four unselected bias nodes and four unselected bias circuits may be shared between inboard and outboard arrays in such a configuration.

Figure 15:
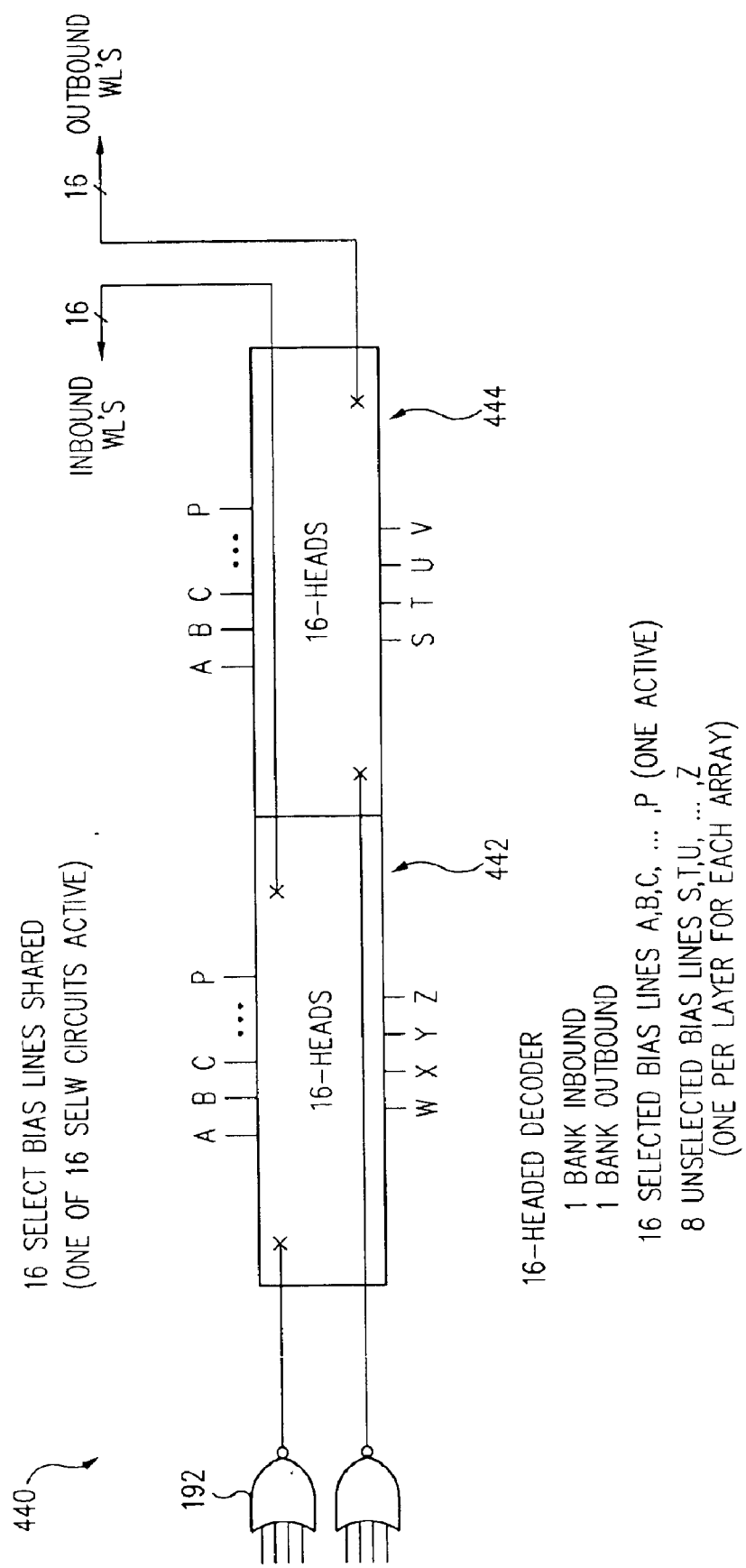
FIG. 15 is a diagram representing an exemplary physical layout arrangement of an sixteen-headed decoder circuit supporting a group of sixteen word lines within an inboard array and a group of sixteen word lines within an outboard array.

In another alternative arrangement, as depicted in FIG. 15, a sixteen-headed decoder is provided for the inboard word lines, and another sixteen-headed decoder is provided for the outboard word lines, which are arranged in two banks. A total of sixteen different selected bias nodes A, B, C, . . . , O, and P are provided to each bank. Only one of the sixteen selected bias nodes is selected, and the independent decoders 192 ensure that, at most, only one inboard or outboard word line is selected at a time.

Four unselected bias nodes W, X, Y, and Z are shared by the inboard bank, because all unselected word lines on a given memory array layer of a given memory array are preferably driven to the same bias condition. The inboard bank drives sixteen inboard word lines, shown exiting to the right of the layout structure. Four additional unselected bias nodes S, T, U, and V are shared by the outboard bank. As before, these are generated separately from the unselected bias nodes for the inboard banks because the unselected word lines in the outboard memory array may be driven to bias conditions different than the unselected word lines of the inboard memory array. The outboard bank drives sixteen outboard word lines, shown exiting to the right of the layout structure.

In this arrangement, only two decoders 192 are required for every group of sixteen inboard and sixteen outboard word lines. Sixteen upper bias circuits are required to generate the sixteen different selected bias nodes A, B, C, . . . , P, and eight lower bias circuits are required to generate the eight different unselected bias nodes S, T, U, V, W, X, Y, and Z. Only two decoders 192 need be interfaced to the pitch of 16 word lines, and two decode nodes are routed out to the array line driver groups 442, 444. Again, the selected bias nodes A, B, C, . . . , P may be shared across the inboard and outboard banks because separate decoders control the inboard bank versus the outboard bank.

This approach increases the number of "external" control circuits to 24 (i.e., 16 selected bias circuits and 8 unselected bias circuits) in order to reduce the number of decoder circuits that must interface with the group of sixteen tightly pitched word lines of the array to two such decoders. This arrangement may be termed a sixteen-headed, one inboard bank, one outboard bank configuration. Each group of 16 word lines associated with a given bank are preferably chosen to be a contiguous block of vertically and laterally adjacent array lines of those array lines exiting to one side of the array, as depicted in FIG. 10 above.

In a preferred embodiment, four different unselected bias voltages are provided, one for each word line layer of each memory sub-array. In this way, unselected word lines on each layer may be biased independently of unselected word lines on other layers, the desirability of which is described more fully in the aforementioned U.S. application Ser. No. 09/897,771, entitled "Method and Apparatus for Biasing Selected and Unselected Array Lines When Writing a Memory Array". As described in this referenced application, such unselected bias nodes may be advantageously generated by a group of four unselected bias generator circuits, one associated with each layer. Each such unselected bias generator circuit receives address signals which are used to decode the selected memory plane (i.e., the selected array line layer) to generate bias voltages or conditions appropriately. Furthermore, in a programmable device, additional signals may be received which communicate the mode of operation to the unselected bias generator circuits. For example, the unselected bit line bias voltage may likely be different for read mode than for write mode, and the multi-headed decoder circuits described above may be effectively used in either mode of operation if the decoder 192 provides a decoded output having suitable voltage levels.

In an alternative embodiment, a single decoder 192 may be used for both the inboard sixteen headed decoder and for the output sixteen headed decoder, although 32 such upper bias circuits would be required to achieve single word line selection from the 32 such array drivers associated with a single decode node.

In preferred embodiments of the invention each array line driver circuit (i.e., array line decoder "head") preferably includes two transistors, as described herein. Nonetheless, other configurations are contemplated for the heads. For example, N-channel transistors may be exclusively used if the various bias conditions lend themselves to such use. Moreover, additional transistors may be employed to accomplish additional functions if layout area permits. Moreover, such multi-headed decoder circuits are also useful in memory arrays having only one plane of memory cells, although the layout density advantages of such decoders are even more beneficial in three-dimensional arrays having more than one memory plane, as the effective density of array lines is potentially even more dense, especially when $4F^2$ memory cells are employed.

A variety of suitable row decoder circuits 192 may be employed, and exemplary ones of which may include a plurality of pre-decoders driving a plurality of decoder/drivers. The pre-decoders may be arranged to pre-decode at least two groups of addresses and generate a number of pre-decoded lines, which are conveyed to a plurality of row decoder circuits. Each row decoder circuit may include a level translator and driver configured to generate suitable bias voltages for reading (at times) and writing (at other times) passive element memory cells. Such exemplary circuits are described in greater detail, in the context of a word line decoder application in the aforementioned "Three-Dimensional Memory Array Incorporating Serial Chain Diode Stack," U.S. application Ser. No. 09/897,705, and further described in the aforementioned "Memory Device with Row and Column Decoder Circuits Arranged in a Checkerboard Pattern under a Plurality of Memory Arrays," U.S. application Ser. No. 09/896,814.

Figure 16:
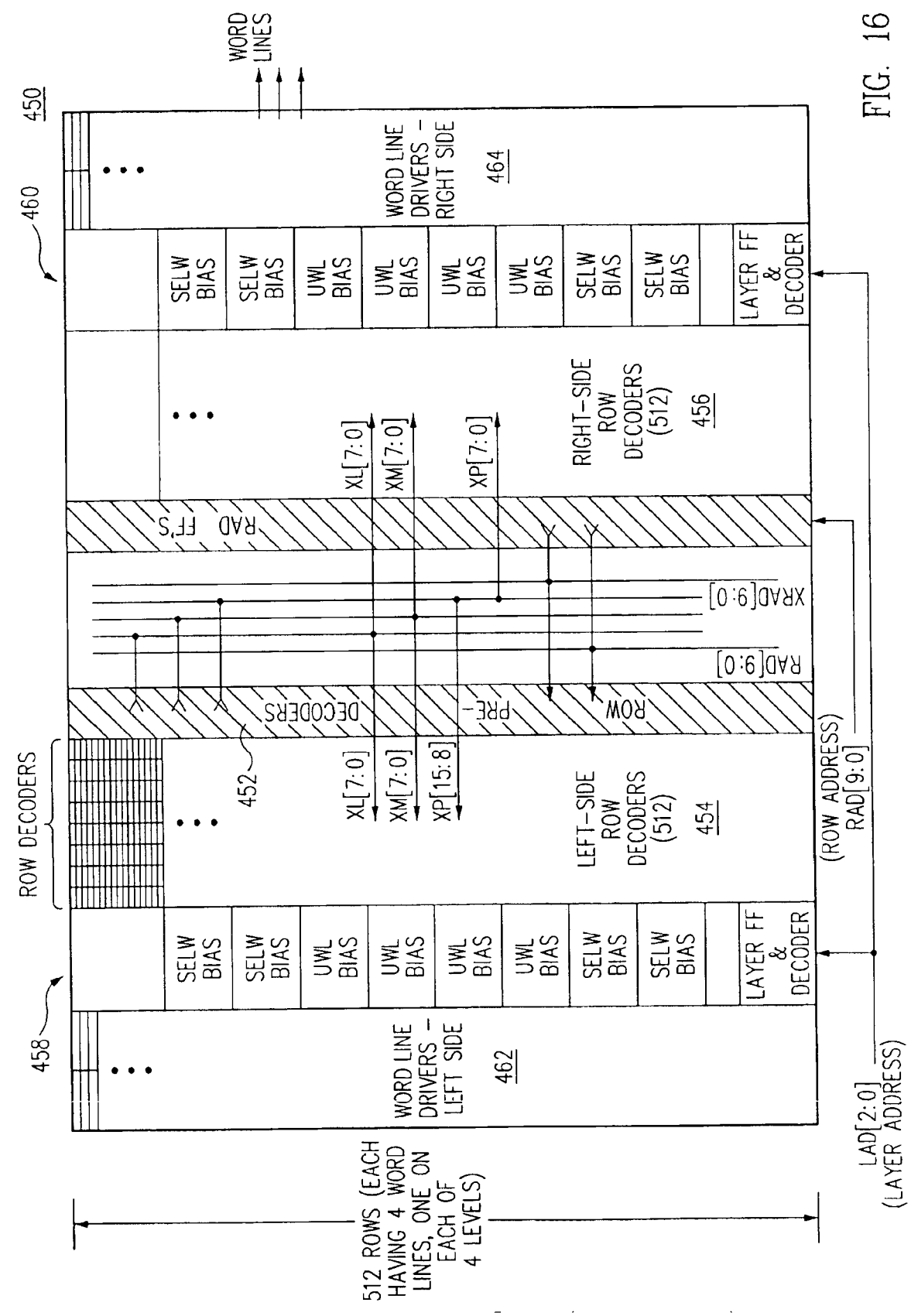
FIG. 16 is a diagram representing an exemplary physical layout arrangement of a multi-headed decoder circuit, including related pre-decoder circuits, decoder circuits, and bias circuits.

Referring now to FIG. 16, a block diagram of a preferred integrated circuit layout 450 is depicted which shows an exemplary configuration of various row select circuits for a sub-array, and which are preferably implemented in the substrate below the memory array. As shown, a group of pre-decoders are arranged vertically near the center of the area, labeled 452. Three groups of pre-decoded lines XL, XM, and XP are generated by the pre-decoders and are routed vertically from top to bottom of the area below the sub-array. Both the XL and XM pre-decode lines traverse both to the left and right to convey their respective pre-decoded address information to both a left-side group of row decoder circuits 454 and right-side group of row decoders 456. The XP pre-decode lines are preferably split, with eight (e.g., XP[15:8] ) traversing to the left side row decoder circuits 454, and the remaining eight (e.g., XP[7:0]) traversing to the right-side row decoder circuits 456. Advantageous use of such split lines is described in co-pending U.S. application Ser. No. 09/990,894, filed Nov. 16, 2001, entitled "Integrated Circuit Memory Array With Fast Test Mode Utilizing Multiple Word Line Selection and Method Therefor" by Scheuerlein, which application is hereby incorporated by reference.

A left-side group of selected and unselected bias generators 458 useful for read and write modes, and a group of word line drivers 462, are disposed outward of the left-side row decoders 454, and which generate both the inboard word lines (for the sub-array "overhead") and the outboard word lines for the adjacent sub-array to the left. A right-side group of selected and unselected bias generators 460 useful for read and write modes, and a group of word line drivers 464, are disposed outward of the right-side row decoders 456, and which generate both the inboard word lines (for the sub-array "overhead") and the outboard word lines for the adjacent sub-array to the right. In this fashion, the word lines (i.e., X-lines) are inter-digitated, with even-numbered word lines driven from one side of the sub-array and odd-numbered word lines driven from the other side. Additional details of bias circuits and layer decoder circuits particularly suitable for a three-dimensional memory array of write-once anti-fuse passive element memory cells are described in the aforementioned U.S. application Ser. No. 09/897,771 entitled "Method and Apparatus for Biasing Selected and Unselected Array Lines When Writing a Memory Array", and in the aforementioned "Three-Dimensional Memory Array Incorporating Serial Chain Diode Stack" by Kleveland, et al, U.S. patent application Ser. No. 09/897,705.

It should be appreciated that the various driver circuits within each bank are generally contemplated to be contiguous, with the various driver circuits of the adjacent bank not commingled therewithin. However, some degree of potential overlap is contemplated at the boundaries between banks, and a driver circuit for one bank may be located generally between driver circuits for another bank without compromising the concept described herein as a "bank." One of ordinary skill should also appreciate that greater or lesser numbers of word lines per layer may be associated with the same word line decode signal, and greater or lesser numbers of word line layers may be decoded by the same word line decode signal, as suits the particular design goals and technology choice for a given design. For example, one or more memory cells may be simultaneously selected on each of two memory array layers. Two word lines may be selected, each on a separate layer, and two bit lines may be selected, each on a separate layer, to simultaneously select a memory cell on each of two separate memory planes. Advantageously this may be accomplished by sharing the word line driver for two word lines, one on each of two different layers. Consequently, the number of layer associated bias circuits may be cut in half, and the programming time may also be reduced. Thus, embodiments in which the number of memory planes is greater than twice the number of unselected bias circuits (i.e., the number of lower bias nodes) is particularly contemplated. Additional details of such word line driver sharing are described in U.S. Pat. No. 6,034,882 to Johnson, entitled "Vertically Stacked Field Programmable Nonvolatile Memory and Method of Fabrication."

In some embodiments having array lines on the upper-most layer of the memory array respectively connected to array lines on the lower-most layer of the memory array, the number of unselected bias circuits may be expressed as one less than the number of array lines exiting to one side to which a decoder interfaces. For example, an integrated circuit having array lines of a first type exiting to one side of the memory array on each of 5 layers may be associated with 4 unselected bias circuits if the upper and lower layers are logically viewed as one layer.

It should be appreciated that the designations top, left, bottom, and right are merely convenient descriptive terms for the four sides of a memory array. Two inter-digitated groups of X-lines are oriented horizontally in the array, and two inter-digitated groups of Y-lines are oriented vertically in the array. Each respective group of X-lines or Y-lines is preferably served by a respective decoder/driver circuit and a respective sense circuit on one of the four sides of the array. Preferred embodiments for row and column circuitry serving a plurality of memory sub-arrays, which embodiments are useful alone or in combination with any of the preferred embodiments described herein, are set forth in the aforementioned "Memory Device with Row and Column Decoder Circuits Arranged in a Checkerboard Pattern under a Plurality of Memory Arrays," U.S. patent application Ser. No. 09/896,814.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently, but not always, connected to the anode terminal of the memory cells, and Y-lines (or bit lines) are frequently, but not always, connected to the cathode terminal of the memory cells. Secondly, the memory organization (e.g., data bus width, number of bits simultaneously read during an operation, etc.) may have some association with viewing one set of the two array lines more aligned with data "bits" rather than data "words."

As used herein, word lines and bit lines represent orthogonal array lines, and follow the common assumption in the art that word lines are driven and bit lines are sensed. Thus, bit lines of an array may also be referred to as sense lines of the array, and may also be referred to as simply array lines (i.e., even though other array lines also exist). No particular implication should be drawn as to word organization by use of such terms.

The embodiments described may show or imply a selected word line being driven to a voltage and a selected bit line being sensed, and may show or imply memory cell anode terminals connected to word lines and cathode terminals connected to bit lines, but other embodiments are specifically contemplated. For example, in a multi-level memory array, an adjacent memory plane may be connected similarly (e.g., a back-to-back diode stack memory array), or may reverse the directionality of memory cells in the adjacent plane (e.g., a serial chain diode stack memory array) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, the sensing circuits described herein may be coupled to word lines rather than bit lines, or may be used for both word lines and bit lines, when sensing a current in a word line rather than in a bit line. Such organizations (and others) are described in the aforementioned "Three-Dimensional Memory Array Incorporating Serial Chain Diode Stack" by Kleveland, et al, U.S. patent application Ser. No. 09/897,705.

The directionality of various array lines in the various figures is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of a given word. Such various array organizations and configurations are well known in the art, and the invention in intended to comprehend a wide variety of such variations.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It will be appreciated by one skilled in the art that any of several expressions may be equally well used when describing the operation of a circuit including the various signals and nodes within the circuit, and no subtle inferences should be read into varied usage within this description. A logic signal has an active level (i.e., active state) and an inactive level (at least for traditional binary logic signals). The active level for some logic signals is a high level (i.e., an "active-high" signal) and for others is a low level (i.e., an "active-low" signal). A logic signal is "asserted" or "activated" when driven to its active level. Conversely, a logic signal is "de-asserted" or "de-activated" when driven to its inactive level. A high logic level is frequently referred to as a logic "1" and a low logic level is frequently referred to as a logic "0" (at least for positive logic). Frequently logic signals are named in a fashion to convey which level is the active level. The schematic diagrams and accompanying description of the signals and nodes should in context be clear.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application-and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. Nonetheless, even though a mere routine exercise of engineering effort is believed to be required to practice this invention, such engineering efforts may result in additional inventive efforts, as frequently occurs in the development of demanding, competitive products.

The present invention is contemplated for advantageous use with any of a wide variety of memory cell technologies and memory array configurations, including both traditional single-level memory arrays and multi-level (i.e., three-dimensional) memory arrays, and particularly those having extremely dense X-line or Y-line pitch requirements. In certain embodiments, the memory cells may be comprised of semiconductor materials, as described in U.S. Pat. No. 6,034,882 to Johnson et al., U.S. Pat. No. 5,835,396 to Zhang, and the aforementioned U.S. patent application Ser. No. 09/560,626 to Knall. In certain embodiments, an antifuse memory cell is contemplated. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0 V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement. Certain passive element memory cells may be used which incorporate layers of organic materials including at least one layer that has a diode-like characteristic conduction and at least one organic material that changes conductivity with the application of an electric field. U.S. Pat. No. 6,055,180 to Gudensen et al. describes such organic passive element arrays. Memory cells comprising materials such as phase-change materials and amorphous solids can also be used. See U.S. Pat. No. 5,751,012 to Wolstenholme et al. and U.S. Pat. No. 4,646,266 to Ovshinsky et al. In other embodiments, three-terminal memory cells may also be employed, rather than two-terminal passive element memory cells, and multiple X-lines (or row lines) selected to sum currents from more than one memory cell on a selected Y-line (or bit line). Such memory cells include flash EPROM and EEPROM cells, which are well known in the art. Moreover, other memory array configurations having extremely dense X-line and/or Y-line pitch requirements are also contemplated such as, for example, those incorporating thin-film transistor (TFT) EEPROM memory cells, as described in "Dense Arrays and Charge Storage Devices, and Methods for Making Same," by Thomas H. Lee, et al., U. S. application Ser. No. 09/927,648, filed Aug. 13, 2001, which application is hereby incorporated by reference.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though the preferred embodiments are described in the context of a passive element memory array, the teachings of the present invention are believed advantageous for use with other types of memory cells, such as certain 3-terminal memory cells. While certain embodiments have been described in the context of a three-dimensional, field-programmable, write once memory array, it should be appreciated that such an array is not necessarily required. Moreover, the embodiments described above are specifically contemplated to be used alone as well as in various combinations. Accordingly, other embodiments, variations, and improvements not described herein are not necessarily excluded from the scope of the invention.

What is claimed is:

1. An intergated circuit comprising:
   a memory array having at least a plurality of array lines on a first layer of the memory array;
   a decoder circuit for generating a plurality of decoder outputs;
   a plurality of array line driver circuits, each responsive to an associated decoder output and having an output coupled to a corresponding one of the plurality of array lines, each respective array line driver circuit comprising
      a first device for driving the respective array line at times to a selected array line bias condition and at other times to an unselected array line bias condition; and
      a second device for driving the respective array line at times to the unselected array line bias condition.

2. The integrated circuit as recited in claim 1 wherein each respective first device is configured to couple the respective array line to an associated bias node which is driven at times to the unselected array line bias condition and at other times to the selected array line bias condition.

3. The integrated circuit as recited in claim 1 wherein:
   the memory array comprises a three-dimensional memory array having a plurality of array lines of a first type on each of at least two layers.

4. The integrated circuit as recited in claim 3 wherein:
   the plurality of array lines of the first type comprise word lines for the array.

5. The integrated circuit as recited in claim 3 wherein:
   the plurality of array lines of the first type comprises bit lines for the array.

6. The integrated circuit as recited in claim 1 wherein:
   the unselected bias condition at times comprises an unselected bias voltage; and
   the unselected bias condition at other times comprises a floating state.

7. The integrated circuit as recited in claim 1 further comprising:

a first bias generator circuit for generating on a first bias node at times the selected array line bias condition and at other times the unselected array line bias condition;

wherein the respective first device of at least two array line driver circuits is coupled to the first bias node.

8. The integrated circuit as recited in claim 7 further comprising:

a second bias generator circuit for generating on a second bias node at times the unselected array line bias condition;

wherein the respective second device of at least two array line driver circuits is coupled to the second bias node.

9. The integrated circuit as recited in claim 1 further comprising:

a first bias generator circuit for generating on a first bias node at times the unselected array line bias condition; and a second bias generator circuit for generating on a second bias node at times the unselected array line bias condition;

wherein the respective first device of at least two array line driver circuits is coupled to the first bias node; and wherein the respective second device of at least two array line driver circuits is coupled to the second bias node.

10. The integrated circuit as recited in claim 6 wherein:

the first device of each array line driver circuits comprises a PMOS transistor having a threshold voltage lower in magnitude than the unselected bias voltage.

11. An integrated circuit comprising:

a memory array having array lines on at least one layer exiting to a given side of the array;

a decoder circuit for generating a plurality of decoder outputs;

a plurality of array line driver circuits, each having an output coupled to a corresponding one of the array lines, a respective plurality of said array line driver circuits coupled to each respective decoder output, each array line driver circuit for coupling its corresponding array line to an associated one of a plurality of first bias nodes when its associated decoder output is selected, and for coupling its corresponding array line to an associated one of a plurality of second bias nodes when its associated decoder output is unselected;

a plurality of first bias circuits for respectively generating a suitable condition on the plurality of first bias nodes; and a plurality of second bias circuits for respectively generating a suitable condition on the plurality of second bias nodes.

12. The integrated circuit as recited in claim 11 wherein:

the suitable condition on at least one of the first bias nodes is at times a selected array line bias condition, whereby an array line driver coupled thereto and driven by a selected decode node couples its associated array line to the selected array line bias condition; and the suitable condition on at least another one of the first bias nodes is at times an unselected array line bias condition, whereby an array line driver coupled thereto and driven by a selected decode node couples its associated array line to the unselected array line bias condition.

13. The integrated circuit as recited in claim 12 wherein the suitable condition on at least one of the first bias nodes is at times a floating node condition, whereby an array line driver coupled thereto and driven by a selected decode node couples its associated array line to a floating node.

14. The integrated circuit as recited in claim 11 wherein:

the number of first bias circuits and thereby the number of first bias nodes is equal to the number of array line drivers coupled to the same decode node.

15. The integrated circuit as recited in claim 11 wherein:

the memory array comprises array lines on each of at least two layers exiting to the given side of the array.

16. The integrated circuit as recited in claim 15 wherein:

the number of second bias circuits and thereby the number of second bias nodes is equal to the number of layers having array lines exiting to the given side of the memory array.

17. The integrated circuit as recited in claim 15 wherein:

the number of second bias circuits and thereby the number of second bias nodes is less than the number of layers having array lines exiting to the given side of the memory array.

18. An integrated circuit comprising:

a three-dimensional memory array having array lines of a first type on at least one layer;

a plurality M of upper bias node circuits for respectively generating a suitable condition on a plurality M of upper bias nodes;

a plurality N of lower bias node circuits for respectively generating on a plurality N of lower bias nodes a bias condition appropriate for unselected array lines on an associated layer;

a decoder circuit comprising a plurality of decoder outputs;

a plurality of array line driver circuits, each having an input coupled to an associated decoder output, and having an output coupled to a corresponding one of the array lines, wherein a respective plurality M of said array line driver circuits is associated with each respective decoder output, and wherein each respective array line driver circuit associated with a given decode node couples its corresponding array line at times to a respective one of the plurality M of upper bias nodes, and couples its corresponding array line at other times to an associated one of the plurality N of lower bias nodes.

19. The integrated circuit as recited in claim 18 wherein:

each respective array line driver circuit associated with a given decode node couples its corresponding array line through a respective first device to a respective one of the plurality M of upper bias nodes when the given decode node is selected, and couples its corresponding array line through a respective second device to an associated one of the plurality N of lower bias nodes when the given decode node is unselected.

20. The integrated circuit as recited in claim 18 wherein:

M is equal to N.

21. The integrated circuit as recited in claim 18 wherein:

M is greater than N.

22. The integrated circuit as recited in claim 18 wherein:

the memory array has array lines of a first type on each of a number of layers which is greater than N.

23. The integrated circuit as recited in claim 18 wherein:

the memory array has array lines of a first type on each of a number of layers which is equal to N or N+1.

24. The integrated circuit as recited in claim 18 wherein:
M is equal to 16;
N is equal to 4; and
the array has 8 memory planes.
25. The integrated circuit as recited in claim 24 wherein:
the memory array has array lines of the first type on 5 layers, each respective one on the lower-most layer being connected to a respective one on the upper-most layer and driven respectively as one logical array line.
26. The integrated circuit as recited in claim 24 wherein:
the memory array has array lines of the first type on 4 layers.
27. The integrated circuit as recited in claim 18 wherein:
the memory array has array lines of the first type on at least 4 layers, and array lines of a first pair of layers share a first one of the N lower bias nodes, and array lines of a second pair of layers share a second one of the N lower bias nodes.
28. An integrated circuit comprising:
a three-dimensional memory array having array lines of a first type on each of at least two layers;
a decoder circuit comprising a plurality of decoder outputs;
a plurality of array line driver circuits, each baying an input coupled to an associated decoder output, and having an output coupled to a corresponding one of the array lines, wherein a respective plurality M of said array line driver circuits is associated with each respective decoder output;
wherein each respective array line driver circuit associated with a given decode node couples its corresponding array line to a respective one of a plurality M of selected bias nodes when its associated decode node is selected, and couples its corresponding array line to an associated one of a plurality N of unselected bias nodes when its associated decode node is not selected;
wherein the array line driver circuits associated with a given decode node correspond to at least two array lines on each of at least two layers of the memory array;
a plurality M of selected bias circuits for respectively generating a suitable condition on the plurality M of selected bias nodes; and
a plurality N of unselected bias circuits for respectively generating on the plurality N of unselected bias nodes a bias condition appropriate for unselected array lines on an associated one of the layers.
29. The integrated circuit as recited in claim 28 wherein:
at most one of the selected bias circuits conveys a selected bias voltage onto its associated selected bias node, and remaining ones of the selected bias circuits convey an unselected bias condition on the remaining selected bias nodes.
30. The integrated circuit as recited in claim 29 wherein:
the unselected bias condition includes an unselected bias voltage for those selected bias nodes associated with unselected array lines on a selected layer of the array.
31. The integrated circuit as recited in claim 29 wherein:
the unselected bias condition includes an unselected bias voltage for those selected bias nodes associated with array lines on a non-selected layer of the array adjacent to the selected layer.
32. The integrated circuit as recited in claim 29 wherein:
the unselected bias condition includes a floating condition for those selected bias nodes associated with array lines on a layers of the array other than the selected layer and layers adjacent to the selected layer.
33. The integrated circuit as recited in claim 28 wherein:
M is equal to N.
34. The integrated circuit as recited in claim 28 wherein:
M is greater than N.
35. The integrated circuit as recited in claim 28 wherein:
the memory array has array lines of a first type on each of a number of layers which is greater than N.
36. The integrated circuit as recited in claim 28 wherein:
the memory array has array lines of a first type on each of a number of layers which is equal to N or N+1.
37. The integrated circuit as recited in claim 28 wherein:
M is equal to 16;
N is equal to 4; and
the array has 8 memory planes.
38. The integrated circuit as recited in claim 37 wherein:
the memory array has array lines of the first type on 5 layers, each respective one on the lower-most layer being connected to a respective one on the upper-most layer and driven respectively as one logical array line.
39. The integrated circuit as recited in claim 37 wherein:
die memory array has array lines of the first type on 4 layers.
40. The integrated circuit as recited in claim 28 wherein:
the memory array has array lines of the first type on at least 4 layers, and array lines of a first pair of layers share a first one of the N lower bias nodes, and array lines of a second pair of layers share a second one of the N lower bias nodes.
41. An integrated circuit comprising:
a memory array having word lines and bit lines;
a decoder circuit comprising a plurality of decoder outputs; and
a respective word line driver circuit for each respective word line, each word line driver circuit responsive to an associated decoder output and having a first device for driving its associated word line to either a selected bias voltage or to an unselected bias condition conveyed on a first bus line, and having a second device for driving its associated word line to an unselected bias condition conveyed on a second bus line.
42. The integrated circuit as recited in clam, 41 wherein:
the memory array comprises a three-dimensional memory array having word lines on at least two layers of the memory array.
43. The integrated circuit as recited in claim 42 wherein:
each decoder output is associated with a respective plurality of word line driver circuits, each having word line driver circuits respectively associated with at least two word lines on each of at least two layers of the memory array.
44. The integrated circuit as recited in claim 41 wherein:
the unselected bias condition at times comprises an unselected bias voltage; and
the unselected bias condition at other times comprises a floating state.
45. The integrated circuit as recited in claim 41 further comprising:
a plurality of first bias generator circuits for generating on a respective plurality of first bus lines at times the selected bias voltage and at other times the unselected bias condition; and
a plurality of second bias generator circuits for generating on a respective plurality of second bus lines at times the unselected bias condition;

wherein the respective first device of at least two word line driver circuits is coupled to one of the first bus lines; and wherein the respective second device of at least two word line driver circuits is coupled to one of the second bus lines.

46. The integrated circuit as recited in claim 44 wherein:

the first device of each word line driver circuit comprises a PMOS transistor having a threshold voltage lower in magnitude than the unselected bias voltage.

\* \* \* \* \*

UNITED STATES PATENT AND TRADEMARK OFFICE
CERTIFICATE OF CORRECTION

PATENT NO. : 6,856,572 B2  
DATED : February 15, 2005  
INVENTOR(S) : Roy E. Scheuerlein and Matthew P. Crowley It is certified that error appears in the above-identified patent and that said Letters Patent is hereby corrected as shown below:

Column 25,
Line 26, the word "baying" should read -- having --.

Column 26,
Line 23, the word "die" should read -- the --.
Line 43, the word "clam" should read -- claim --.

Signed and Sealed this

Twenty-fourth Day of May, 2005

JON W. DUDAS
*Director of the United States Patent and Trademark Office*